United States Patent
Lee et al.

(10) Patent No.: US 11,284,028 B2
(45) Date of Patent: Mar. 22, 2022

(54) IMAGE SENSORS WITH MULTIPLE FUNCTIONS AND IMAGE SENSOR MODULES INCLUDING THE SAME

(71) Applicant: Samsung Electronics Co., Ltd., Suwon-si (KR)

(72) Inventors: Tae-Yon Lee, Seoul (KR); Gwi-Deok Ryan Lee, Suwon-si (KR); Masaru Ishii, Hwaseong-si (KR); Dong-Mo Im, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/950,122

(22) Filed: Nov. 17, 2020

(65) Prior Publication Data
US 2021/0075985 A1 Mar. 11, 2021

Related U.S. Application Data

(63) Continuation of application No. 16/239,662, filed on Jan. 4, 2019, now Pat. No. 10,868,988.

(30) Foreign Application Priority Data

Feb. 20, 2018 (KR) .......................... 10-2018-0020021

(51) Int. Cl.
*H04N 5/369* (2011.01)
*H01L 27/30* (2006.01)
(Continued)

(52) U.S. Cl.
CPC ..... *H04N 5/36965* (2018.08); *G06K 9/00604* (2013.01); *G06K 9/209* (2013.01);
(Continued)

(58) Field of Classification Search
CPC .... H04N 5/36965; H04N 5/332; H04N 5/379; H04N 9/04553; H04N 9/04563;
(Continued)

(56) References Cited

U.S. PATENT DOCUMENTS 7,625,774 B2 12/2009 Lee
9,426,399 B2 8/2016 Yamaguchi
(Continued)

FOREIGN PATENT DOCUMENTS

JP 2017038011 A 2/2017
KR 20170058096 A 5/2017

OTHER PUBLICATIONS

Aihara, Satoshi, et al., "Stacked Image Sensor with Green- and Red-Sensitive Organic Photoconductive Films Applying Zinc Oxide Thin-Film Transistors to a Signal Readout Circuit," IEEE Transactions on Electron Devices, vol. 56, No. 11, Nov. 2009.
(Continued)

*Primary Examiner* — Seung C Sohn
(74) *Attorney, Agent, or Firm* — Myers Bigel, P.A.

(57) ABSTRACT

An image sensor includes a first sensor pixel and a second sensor pixel that vertically overlap each other. The first sensor pixel includes a first signal generation circuit, and a first photoelectric converter that is connected to the first signal generation circuit and configured to generate first information from light having a first wavelength. The second sensor pixel includes a second signal generation circuit, and a second photoelectric converter that is connected to the second signal generation circuit and configured to generate second information from light having a second wavelength. A first horizontal surface area of the first photoelectric converter is different from a second horizontal surface area of the second photoelectric converter. An image sensor module includes the image sensor, a light source configured to emit light to a target object, and a dual band pass filter configured to selectively pass light reflected from the target object.

20 Claims, 25 Drawing Sheets

(51) Int. Cl.
*G06K 9/20* (2006.01)
*H01L 27/146* (2006.01)
*G06K 9/00* (2022.01)
*H01L 27/28* (2006.01)
*H04N 9/04* (2006.01)
*H04N 5/33* (2006.01)

(52) U.S. Cl.
CPC .... *H01L 27/1462* (2013.01); *H01L 27/14603* (2013.01); *H01L 27/14649* (2013.01); *H01L 27/14669* (2013.01); *H01L 27/286* (2013.01); *H01L 27/307* (2013.01); *H04N 5/332* (2013.01); *H04N 5/379* (2018.08); *H04N 9/04553* (2018.08); *H04N 9/04563* (2018.08); *H01L 27/14641* (2013.01)

(58) Field of Classification Search
CPC ...... H04N 5/2253; H04N 5/335; H04N 5/369; G06K 9/00604; G06K 9/209; G06K 9/2018; G06K 9/00597; H01L 27/14603; H01L 27/1462; H01L 27/14649; H01L 27/14669; H01L 27/286; H01L 27/307; H01L 27/14641; H01L 27/146; H01L 27/14643; H01L 27/14665
See application file for complete search history.

(56) References Cited

U.S. PATENT DOCUMENTS

| | | | |
|---|---|---|---|
| 9,601,547 | B2 | 3/2017 | Hatano et al. |
| 9,654,709 | B2 | 5/2017 | Murata |
| 10,347,688 | B2 * | 7/2019 | Kim ................... H01L 27/14609 |
| 10,411,054 | B2 * | 9/2019 | Kwag ............... H01L 29/78675 |
| 2004/0061152 | A1 | 4/2004 | Kashiura et al. |
| 2011/0109776 | A1 | 5/2011 | Kawai |
| 2017/0141149 | A1 | 5/2017 | Lee et al. |
| 2017/0170239 | A1 | 6/2017 | Lee et al. |
| 2018/0204882 | A1 | 7/2018 | Segawa et al. |

OTHER PUBLICATIONS

S. Machida, et al., 2017 ISSCC, p. 188-208.

* cited by examiner

IMAGE SENSORS WITH MULTIPLE FUNCTIONS AND IMAGE SENSOR MODULES INCLUDING THE SAME

CROSS-REFERENCE TO RELATED APPLICATIONS

This application is a continuation of U.S. application Ser. No. 16/239,662, filed on Jan. 4, 2019, which claims the benefit of Korean Patent Application No. 10-2018-0020021, filed on Feb. 20, 2018, in the Korean Intellectual Property Office, and the entire contents of each above-identified application are incorporated by reference herein.

TECHNICAL FIELD

Aspects of the present disclosure relate to image sensors and image sensor modules including the same, and more particularly, to image sensors with multiple functions and image sensor modules including the same.

BACKGROUND

An image sensor is a device that converts an optical image into an electrical signal. Recently, with increasing development of computer-related industries and communication-related industries, demand for image sensors with improved performance characteristics is increasing in various fields and for various usages. In particular, as the number of modules of image sensors increases in an electronic device such as a mobile device, technology for integrating a plurality of sensors having various functions into one image sensor is increasingly desirable.

SUMMARY

The present disclosure provides an image sensor having a structure in which a plurality of functions are integrated. In particular, the present disclosure provides methods, devices, and techniques for integrating a plurality of sensors having different functions into one image sensor, and such image sensors are capable of improved sensitivity within a unit area.

The present disclosure also provides an image sensor module having improved sensitivity within a unit area, with a structure in which a plurality of sensors having different functions are integrated into one image sensor, and is capable of obtaining a plurality of pieces of information.

Some embodiments of the inventive concepts provide an image sensor. The image sensor may include: a substrate extending in a horizontal direction; a first sensor pixel including a first signal generation circuit formed at a first level on the substrate, and a first photoelectric converter connected to the first signal generation circuit and configured to generate first information from a first signal obtained from light having a first wavelength; and a second sensor pixel including a second signal generation circuit formed at the first level on the substrate, and a second photoelectric converter connected to the second signal generation circuit and vertically overlapping the first photoelectric converter and configured to generate second information different from the first information from a second signal obtained from light having a second wavelength, wherein a first area occupied by the first photoelectric converter in the horizontal direction is different from a second area occupied by the second photoelectric converter.

Some embodiments of the inventive concepts provide an image sensor that may include: a plurality of first sensor pixels repeatedly arranged at a first pitch and each including a first photodiode; a plurality of second sensor pixels repeatedly arranged at a second pitch different from the first pitch at positions vertically overlapping the plurality of first sensor pixels and each including a second photodiode; and a signal generation circuit shared by the plurality of first sensor pixels and the plurality of second sensor pixels and vertically overlapping the first photodiode and the second photodiode.

Some embodiments of the inventive concepts provide an image sensor module. The image sensor module may include: an image sensor according to the present disclosure; a light source configured to emit light to a target object; and a dual band pass filter configured to selectively pass light having a first wavelength and light having a second wavelength selected from a near-infrared range among light reflected from the target object, wherein, in the image sensor, the second photodiode is closer to the dual band pass filter than the first photodiode, and the second photodiode is configured to absorb a selected light from among the light having the first wavelength and the light having the second wavelength and pass an unselected light from among the light having the first wavelength and the light having the second wavelength.

BRIEF DESCRIPTION OF THE DRAWINGS

The inventive concepts, and aspects thereof, will be more clearly understood from the following detailed description in which examples of embodiments of the inventive concepts are provided, taken in conjunction with the accompanying drawings in which.

DETAILED DESCRIPTION

Figure 1:
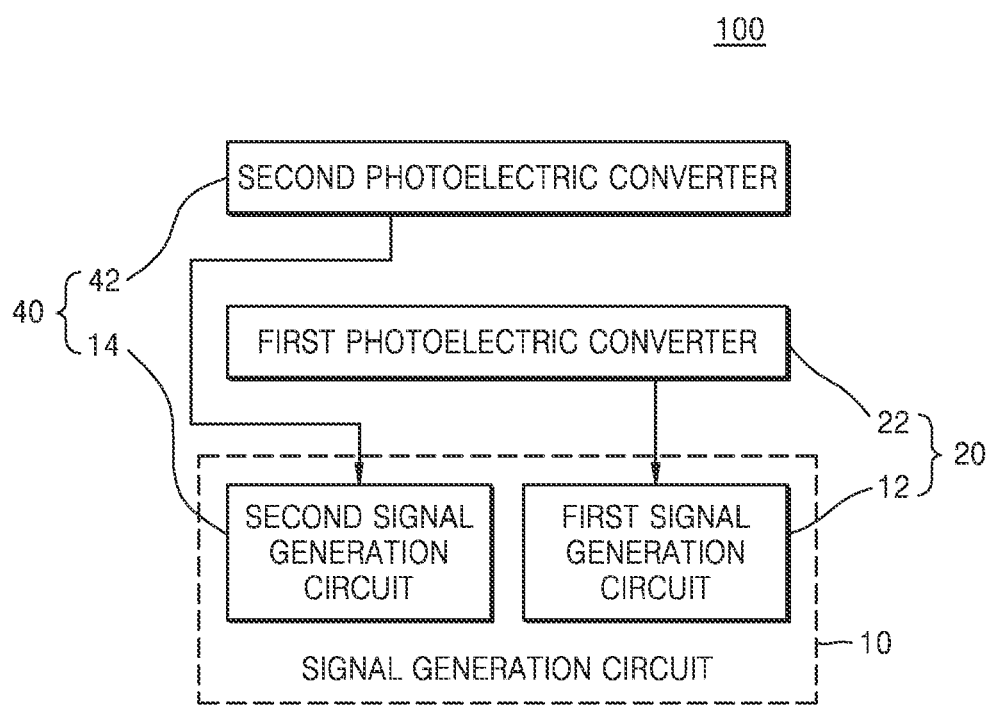
FIG. 1 is a block diagram illustrating a schematic configuration of an image sensor according to some embodiments.

Hereinafter, some examples of embodiments of the inventive concepts will be described in detail with reference to the accompanying drawings. Like reference numerals are used to refer to like elements throughout the drawings, and a redundant description thereof may be omitted for conciseness.

FIG. 1 is a block diagram illustrating a schematic configuration of an image sensor 100 according to some embodiments.

Referring to FIG. 1, the image sensor 100 may include a first sensor pixel 20 and a second sensor pixel 40, which may vertically overlap each other.

The first sensor pixel 20 may include a first signal generation circuit 12, and a first photoelectric converter 22 connected to the first signal generation circuit 12. The first sensor pixel 20 may be configured to generate first information from a first signal obtained from light having a first wavelength.

The second sensor pixel 40 may include a second signal generation circuit 14, and a second photoelectric converter 42 connected to the second signal generation circuit 14. The second photoelectric converter 42 may include an organic film. The second sensor pixel 40 may be configured to generate second information, which may be different from the first information, from a second signal obtained from light having a second wavelength, which may be different from the first wavelength. The second photoelectric converter 42 may vertically overlap the first photoelectric converter 22. For example, the second photoelectric converter 42 may overlap the first photoelectric converter 22 in a Z-direction.

In some embodiments, the first wavelength and the second wavelength may be different wavelengths selected from a near-infrared range. For example, the first wavelength and the second wavelength may be different wavelengths selected in a range of about 810 nm to about 940 nm. In some embodiments, the first sensor pixel 20 may be configured to generate depth information of a first target object from light having a wavelength of about 940 nm, and the second sensor pixel 40 may be configured to generate iris information of a second target object from light having a wavelength of about 810 nm. In some embodiments, the first target object and the second target object may be the same target object.

The first signal generation circuit 12 and the second signal generation circuit 14 may be parts of a signal generation circuit 10. The first signal generation circuit 12 that is a part of the signal generation circuit 10 may be part of the first sensor pixel 20, and the second signal generation circuit 14 that is a part of the signal generation circuit 10 may be part of the second sensor pixel 40.

The signal generation circuit 10, the first photoelectric converter 22, and the second photoelectric converter 42 may be formed at different levels and may vertically overlap one another, for example, in the Z-direction.

The signal generation circuit 10 may be formed or disposed at a level that is different from a level at which the first photoelectric converter 22 is formed or disposed and a level at which the second photoelectric converter 42 is formed or disposed. The first signal generation circuit 12 may vertically overlap the first photoelectric converter 22, and the second signal generation circuit 14 may vertically overlap the second photoelectric converter 42. The first signal generation circuit 12 and the second signal generation circuit 14 may be at the same level, and may be spaced apart from the first photoelectric converter 22 by substantially the same vertical distance.

In a horizontal direction, such as an X-direction and/or a Y-direction, an area occupied by the first sensor pixel 20 may be different from an area occupied by the second sensor pixel 40, and an area occupied by the first photoelectric converter 22 included in the first sensor pixel 20 may be different from an area occupied by the second photoelectric converter 42 included in the second sensor pixel 40. Stated differently, a horizontal surface area of the first sensor pixel 20 may be different from a horizontal surface area of the second sensor pixel 40. A horizontal surface area of the first photoelectric converter 22 may be different from a horizontal surface area of the second photoelectric converter 42.

Figure 2:
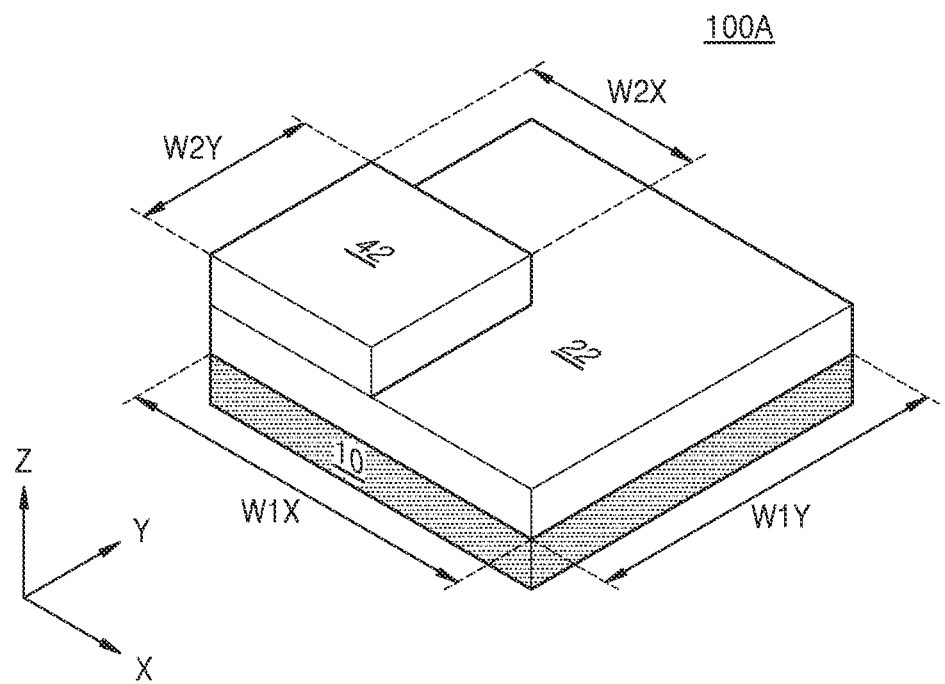
FIG. 2 is a schematic perspective view of an image sensor according to some embodiments.

FIG. 2 is a schematic perspective view of an image sensor 100A, according to some embodiments. The image sensor 100A may include a signal generation circuit 10, a first photoelectric converter 22, and a second photoelectric converter 42, similar to those of the image sensor 100 of FIG. 1.

Referring to FIGS. 1 and 2, a size of the first sensor pixel 20 may be different from a size of the second sensor pixel 40. As illustrated in FIG. 2, the first photoelectric converter 22 of the first sensor pixel 20 may have an X-direction width W1X and a Y-direction width W1Y, and the second photoelectric converter 42 of the second sensor pixel 40 may have an X-direction width W2X and a Y-direction width W2Y. The X-direction width W2X and the Y-direction width W2Y of the second photoelectric converter 42 may be less than the X-direction width W1X and the Y-direction width W1Y of the first photoelectric converter 22, respectively. Accordingly, in an arbitrary first horizontal plane such as an X-Y plane, an area occupied by the second photoelectric converter 42 may be less than an area occupied by the first photoelectric converter 22 in an arbitrary second horizontal plane that is parallel with the first horizontal plane.

In a horizontal direction or plane, an area occupied by the signal generation circuit 10 may fall within an area occupied by the first photoelectric converter 22. In the signal generation circuit 10, the first signal generation circuit 12 may be disposed below the first photoelectric converter 22 at a position vertically overlapping the first photoelectric converter 22. An area occupied by the first signal generation circuit 12 may fall within an area occupied in the horizontal direction by the first photoelectric converter 22. The second signal generation circuit 14 may be disposed below the first photoelectric converter 22 and the second photoelectric converter 42 at a position vertically overlapping the second photoelectric converter 42. An area occupied by the second signal generation circuit 14 may fall within an area occupied in the horizontal direction by the second photoelectric converter 42. Accordingly, an area or volume occupied by the second sensor pixel 40 may be less than an area or volume occupied by the first sensor pixel 20.

Figure 3:
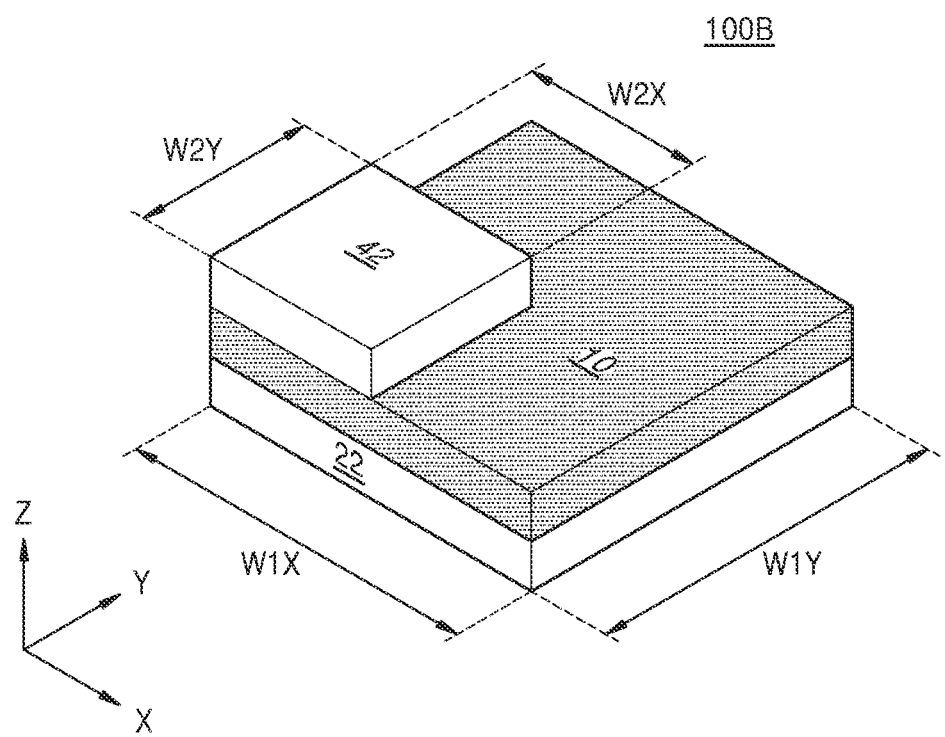
FIG. 3 is a schematic perspective view of an image sensor according to some embodiments.

FIG. 3 is a schematic perspective view of an image sensor 100B, according to some embodiments. The image sensor 100B may include a signal generation circuit 10, a first photoelectric converter 22, and a second photoelectric converter 42, as discussed above with reference to FIG. 1.

Referring to FIG. 3, the components of the image sensor 100B may have substantially the same sizes and/or dimensions as those of the image sensor 100A illustrated in FIG. 2. However, the first signal generation circuit 12 and the second signal generation circuit 14 constituting the signal generation circuit 10 may be disposed above the first photoelectric converter 22 so as to vertically overlap the first photoelectric converter 22. In particular, the second signal generation circuit 14 included in the signal generation circuit 10 may be disposed between the first photoelectric converter 22 and the second photoelectric converter 42.

Figure 4A:
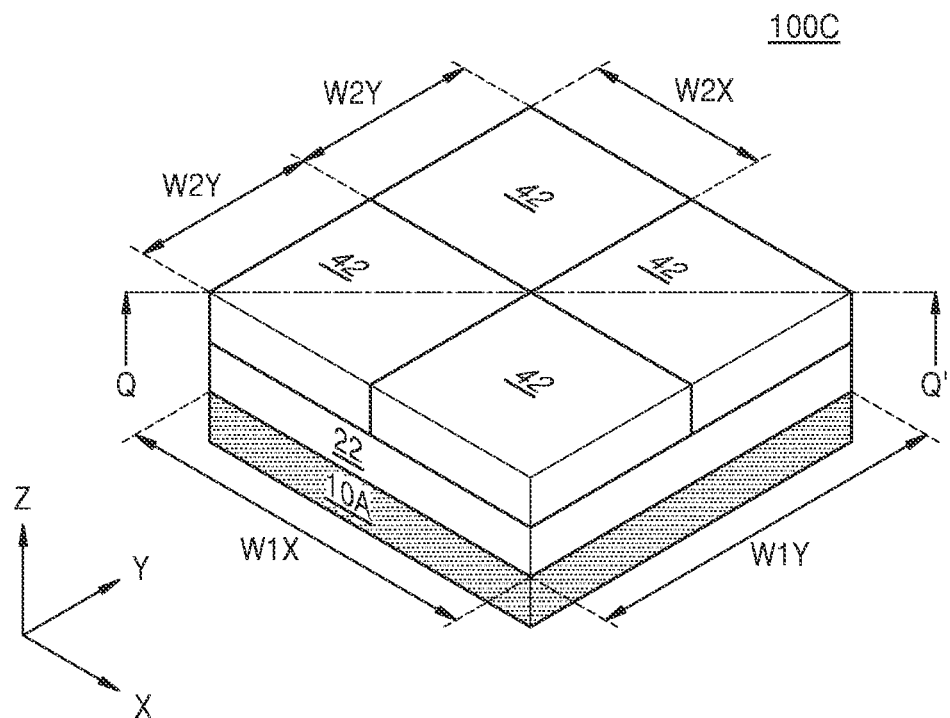
FIG. 4A is a schematic perspective view of an image sensor according to some embodiments.
Figure 4B:
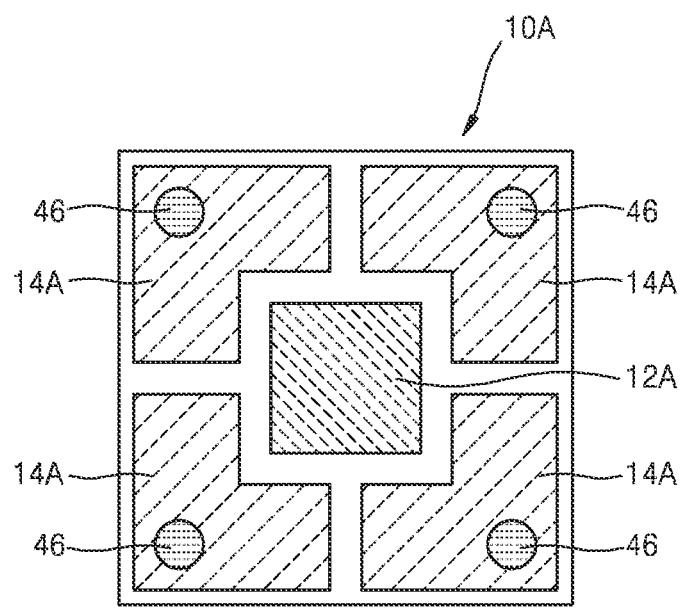
FIG. 4B is a schematic plan view of a signal generation circuit included in the image sensor of FIG. 4A.
Figure 4C:
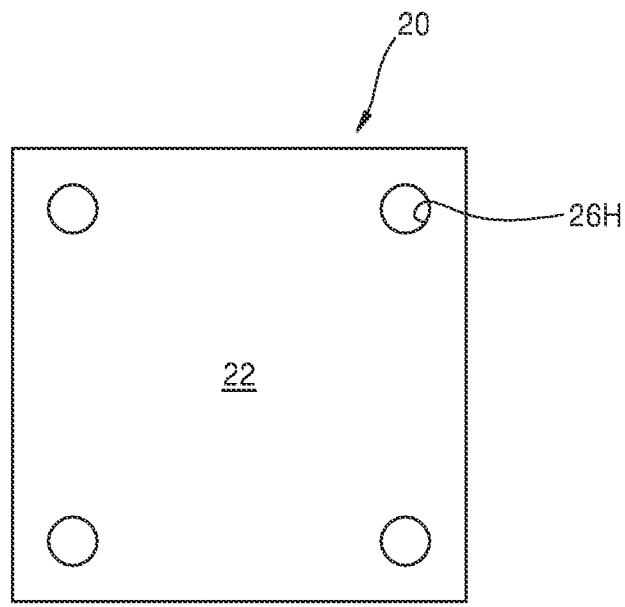
FIG. 4C is a schematic plan view of a first sensor pixel included in the image sensor of FIG. 4A.
Figure 4D:
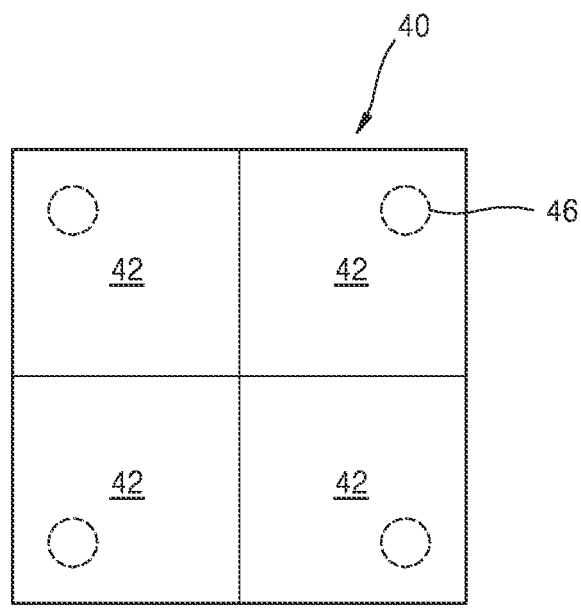
FIG. 4D is a schematic plan view of a plurality of second photoelectric converters included in the image sensor of FIG. 4A.

FIGS. 4A to 4D are diagrams for describing an image sensor 100C, according to some embodiments. The image sensor 100C may include a signal generation circuit 10, a first photoelectric converter 22, and a plurality of second photoelectric converters 42, that are similar to the components with identical reference signs of the image sensor 100 of FIG. 1. FIG. 4A is a schematic perspective view of the image sensor 100C, FIG. 4B is a schematic plan view of a signal generation circuit 10A included in the image sensor 100C, FIG. 4C is a schematic plan view of a first sensor pixel 20 included in the image sensor 100C, and FIG. 4D is a schematic plan view of the plurality of second photoelectric converters 42 included in the image sensor 100C.

Referring to FIGS. 4A to 4D, four second photoelectric converters 42 may be disposed above one first photoelectric converter 22, and the four second photoelectric converters 42 may vertically overlap the one first photoelectric converter 22.

In some embodiments, an X-direction width W1X and a Y-direction width W1Y of the first photoelectric converter 22 may be respectively about twice an X-direction width W2X and a Y-direction width W2Y of one of the second photoelectric converters 42. An area occupied by the one first photoelectric converter 22 may be about four times an area occupied by one second photoelectric converter 42.

The signal generation circuit 10A of FIG. 4B may correspond to the signal generation circuit 10 of FIG. 1. The signal generation circuit 10A may be spaced apart from the four second photoelectric converters 42, with the first photoelectric converter 22 therebetween.

As illustrated in FIG. 4B, the signal generation circuit 10A may include one first signal generation circuit 12A and four second signal generation circuits 14A. The four second signal generation circuits 14A may be formed at the same level as that of the one first signal generation circuit 12A. The four second signal generation circuits 14A may be respectively connected to the four second photoelectric converters 42A through four via electrodes 46 extending through the one first photoelectric converter 22. As illustrated in FIG. 4C, the first photoelectric converter 22 may have four via holes 26H through which the four via electrodes 46 pass. In FIG. 4D, the positions at which the via electrodes 46 are disposed among the four second photoelectric converters 42 are indicated by dashed lines.

The first signal generation circuit 12A and the second signal generation circuit 14A may correspond to the first signal generation circuit 12 and the second signal generation circuit 14 illustrated in FIG. 1. The one first signal generation circuit 12A of FIG. 4B and the first photoelectric converter 22 of FIGS. 4A and 4C may be part of one first sensor pixel 20. Ones of the four second signal generation circuits 14A of FIG. 4B and respective ones of the four second photoelectric converters 42 of FIGS. 4A and 4D may be part of four different second sensor pixels 40.

Figure 5:
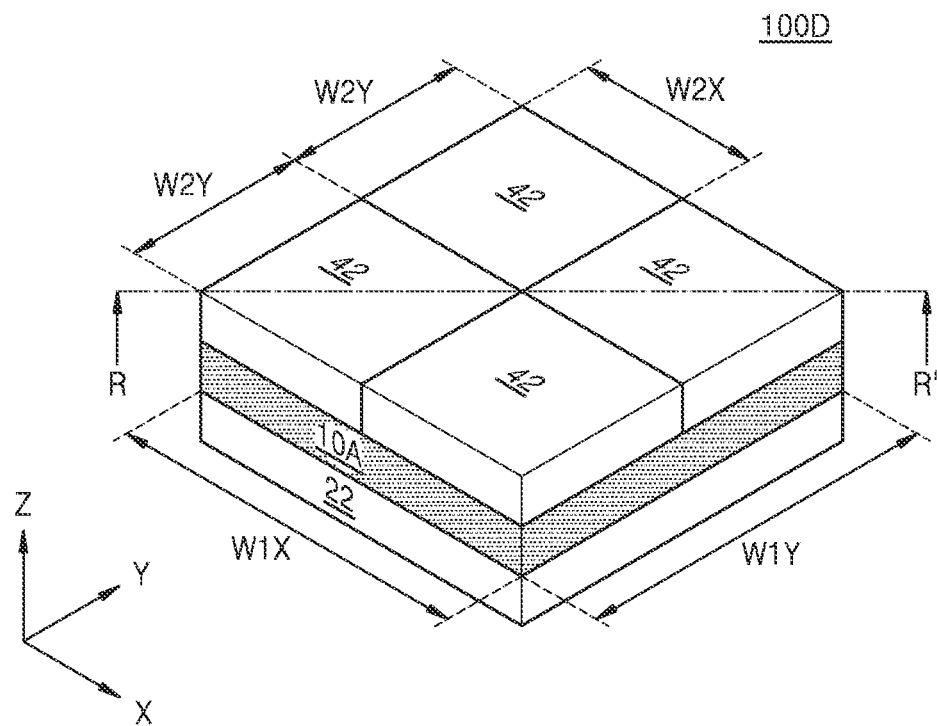
FIG. 5 is a schematic perspective view of an image sensor according to some embodiments.

FIG. 5 is a schematic perspective view of an image sensor 100D, according to some embodiments. The image sensor 100D may include a signal generation circuit 10, a first photoelectric converter 22, and a plurality of second photoelectric converters 42, that are similar to the components with identical reference signs of the image sensor 100 of FIG. 1.

Referring to FIG. 5, the components of the image sensor 100D may have substantially the same dimensions and/or sizes as that of the image sensor 100C described with reference to FIGS. 4A to 4D. However, in the image sensor 100D of FIG. 5, the signal generation circuit 10A may be disposed above the first photoelectric converter 22 so as to vertically overlap the first photoelectric converter 22. The signal generation circuit 10A may be disposed between one first photoelectric converter 22 and four second photoelectric converters 42. In particular, four second signal generation circuits 14A (see FIG. 4B) included in the signal generation circuit 10A may be connected to the four second photoelectric converters 42, respectively, and may vertically overlap the four second photoelectric converters 42, respectively. In this case, the four via electrodes 46 and the four via holes 26H described with reference to FIGS. 4B to 4D may be omitted.

Figure 6A:
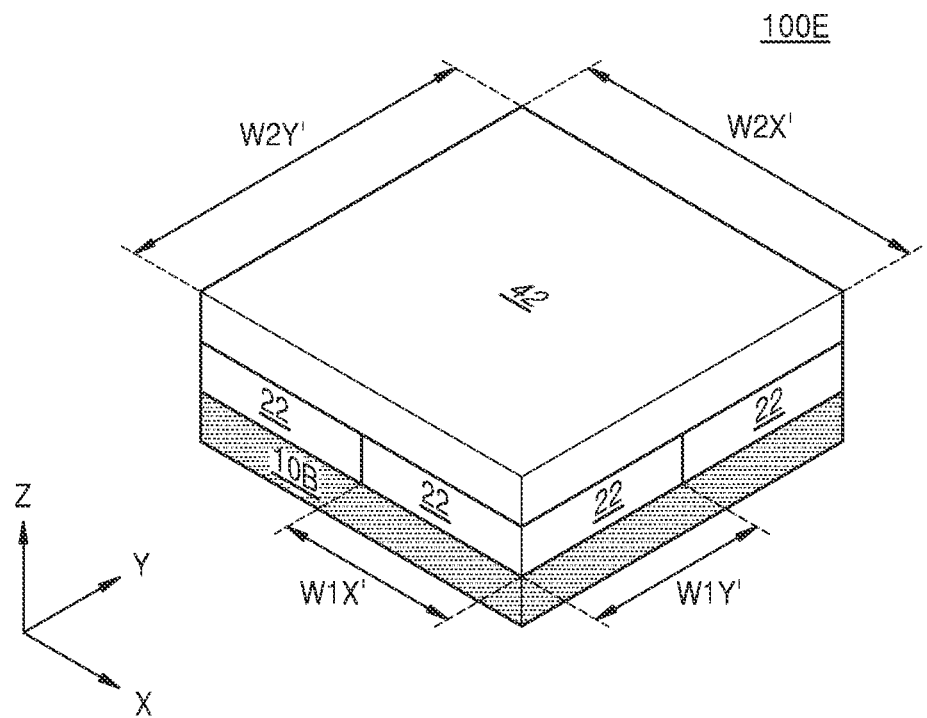
FIG. 6A is a schematic perspective view of an image sensor according to some embodiments.
Figure 6B:
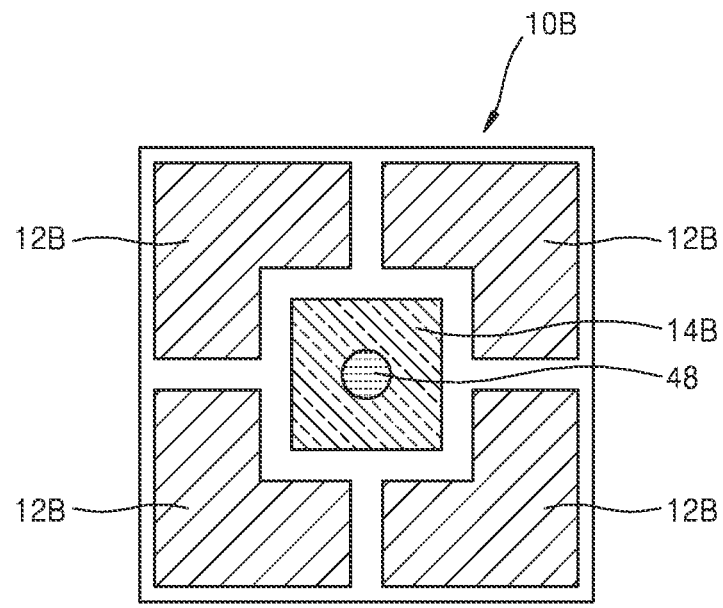
FIG. 6B is a schematic plan view of a signal generation circuit included in the image sensor of FIG. 6A.
Figure 6C:
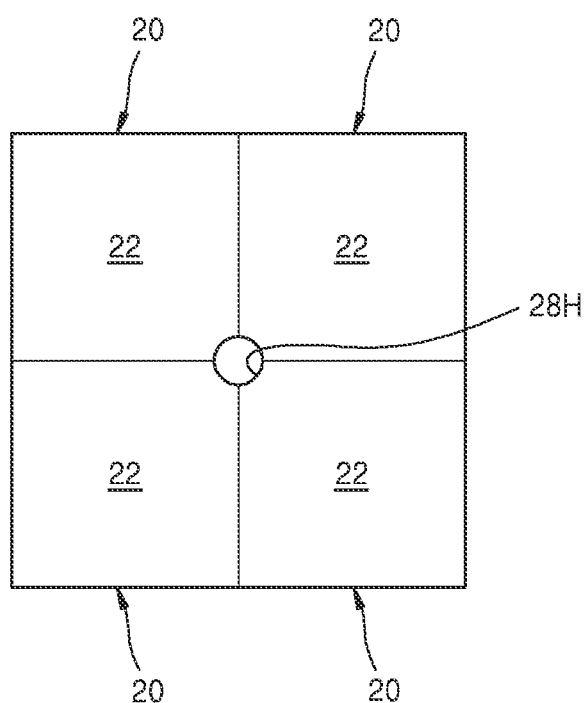
FIG. 6C is a schematic plan view of a plurality of first sensor pixels included in the image sensor of FIG. 6A.
Figure 6D:
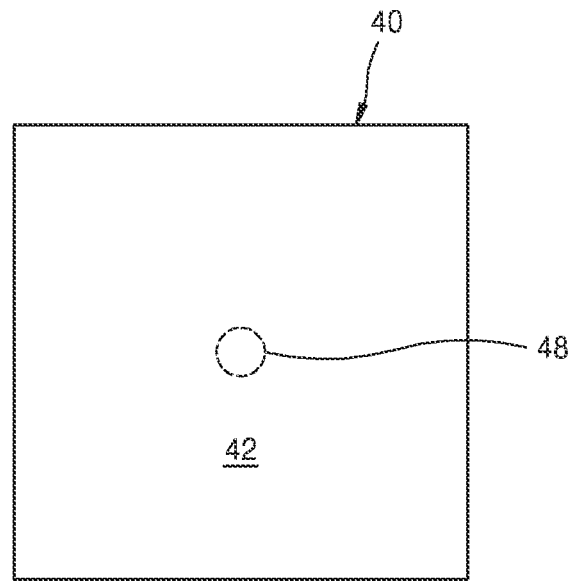
FIG. 6D is a schematic plan view of a second photoelectric converter included in the image sensor of FIG. 6A.

FIGS. 6A to 6D are diagrams for describing an image sensor 100E, according to some embodiments. The image sensor 100E may include a signal generation circuit 10, a plurality of first photoelectric converters 22, and one second photoelectric converter 42, that are similar to the components with identical reference signs of the image sensor 100 of FIG. 1. FIG. 6A is a schematic perspective view of the image sensor 100E, FIG. 6B is a schematic plan view of a signal generation circuit 10B included in the image sensor 100E, FIG. 6C is a schematic plan view of a plurality of first sensor pixels 20 included in the image sensor 100E, and FIG. 6D is a schematic plan view of a second photoelectric converter 42 included in the image sensor 100E.

Referring to FIGS. 6A to 6D, in the image sensor 100E, one second photoelectric converter 42 may be disposed above four first photoelectric converters 22, and the four first photoelectric converters 22 may vertically overlap the one second photoelectric converter 42.

In an arbitrary horizontal direction on an X-Y plane, an area occupied by one of the first photoelectric converters 22 may be less than an area occupied by the one second photoelectric converter 42.

In the image sensor 100E, each first photoelectric converter 22 may have an X-direction width W1X' and a Y-direction width W1Y', and the second photoelectric converter 42 may have an X-direction width W2X' and a Y-direction width W2Y'. The X-direction width W2X' and the Y-direction width W2Y' of the second photoelectric converter 42 may be greater than the X-direction width W1X' and the Y-direction width W1Y' of each of the first photoelectric converters 22.

The signal generation circuit 10B may be disposed below the four first photoelectric converters 22, and may be vertically overlapped by the four first photoelectric converters 22 and the one second photoelectric converter 42. In the horizontal direction, an area occupied by the signal generation circuit 10B may fall within an area occupied by the second photoelectric converter 42 and may be greater than an area occupied by the one first photoelectric converter 22.

In some embodiments, an X-direction width W2X' and a Y-direction width W2Y' of the second photoelectric converter 42 may be respectively about twice an X-direction width W1X' and a Y-direction width W1Y' of one of the first photoelectric converters 22. An area occupied by the one second photoelectric converter 42 may be about four times an area occupied by one first photoelectric converter 22.

The signal generation circuit 10B may correspond to the signal generation circuit 10 of FIG. 1. The signal generation circuit 10B may be spaced apart from the one second photoelectric converter 42, with the four first photoelectric converters 22 therebetween.

As illustrated in FIG. 6B, the signal generation circuit 10B may include four first signal generation circuits 12B and one second signal generation circuit 14B. The one second signal generation circuit 14B may be formed at the same level as those of the four first signal generation circuits 12B. The one second signal generation circuit 14B may be connected to the one second photoelectric converter 42 through a via electrode 48 extending to penetrate an insulating layer (not illustrated) of a level at which the four first photoelectric converters 22 are formed. The first signal generation circuit 12B and the second signal generation circuit 14B may correspond to the first signal generation circuit 12 and the second signal generation circuit 14 illustrated in FIG. 1, respectively. As illustrated in FIG. 6C, a via hole 28H through which the via electrode 48 passes may be formed at an approximately central portion where the four first photoelectric converters 22 meet. In FIG. 6D, the positions at which the via electrode 48 is disposed in the second photoelectric converter 42 is indicated by a dashed line.

Ones of the four first signal generation circuits 12B of FIG. 6B and respective ones of the four first photoelectric converters 22 of FIGS. 6A and 6C may be part of four different first sensor pixels 20. The one second signal generation circuit 14B of FIG. 6B and the one second photoelectric converter 42 of FIGS. 6A and 6D may be part of one second sensor pixel 40.

Figure 7:
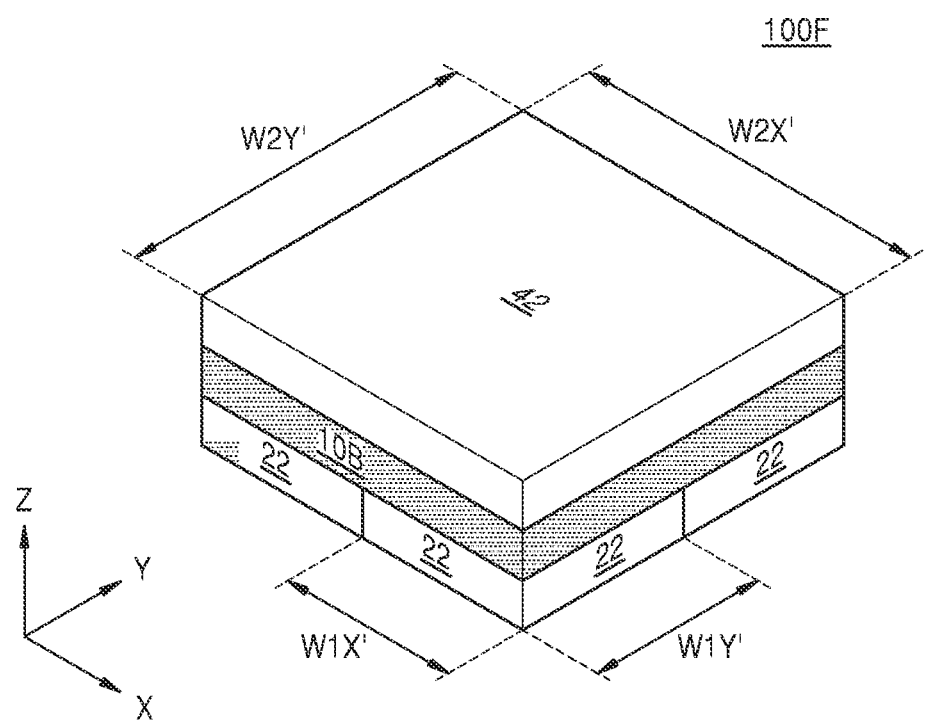
FIG. 7 is a schematic perspective view of an image sensor according to some embodiments.

FIG. 7 is a schematic perspective view of an image sensor 100F, according to some embodiments. The image sensor 100E may include a signal generation circuit 10, a plurality of first photoelectric converters 22, and one second photoelectric converter 42, that are similar to the components with identical reference signs of the image sensor 100 of FIG. 1.

Referring to FIG. 7, the components of the image sensor 100F may have substantially the same sizes and/or dimensions as that of the image sensor 100E described with reference to FIGS. 6A to 6D. However, the signal generation circuit 10B may be disposed above four first photoelectric converters 22 so as to vertically overlap four first photoelectric converters 22. The signal generation circuit 10B may be disposed between four first photoelectric converters 22 and one second photoelectric converter 42. In particular, four first signal generation circuits 12B included in the signal generation circuit 10B (see FIG. 6B) may be connected to the four first photoelectric converters 22, respectively, and may vertically overlap the four first photoelectric converters 22, respectively. In this case, the via electrode 48 and the via hole 28H described with reference to FIGS. 6B to 6D may be omitted.

The image sensors 100, 100A, 100B, 100C, 100D, 100E, and 100F described with reference to FIGS. 1 to 7, according to the embodiments, may not include a color filter.

Figure 8:
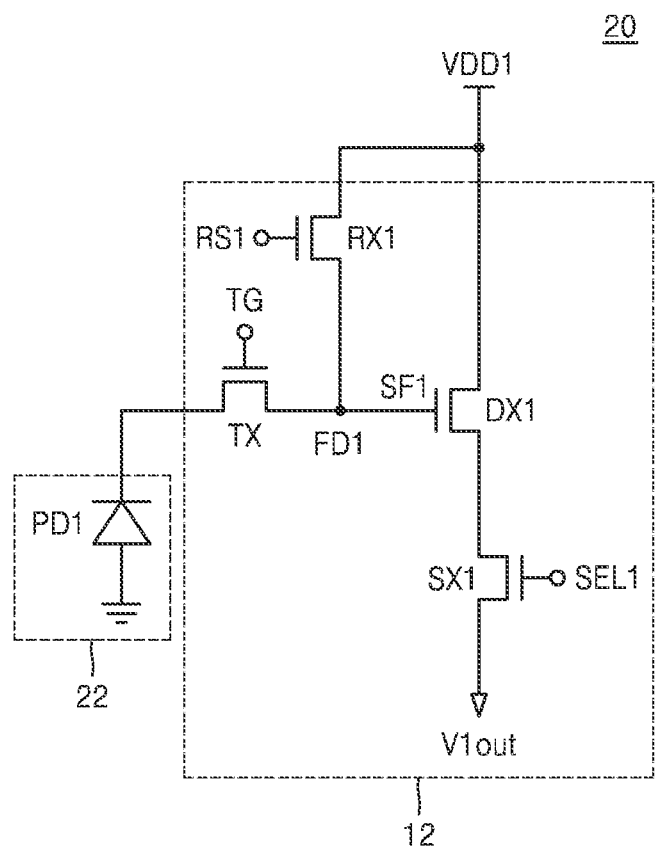
FIG. 8 is a circuit diagram illustrating a first sensor pixel of an image sensor according to some embodiments.

FIG. 8 is a circuit diagram of the first sensor pixel 20 illustrated in FIG. 1.

Referring to FIGS. 1 and 8, the first photoelectric converter 22 of the first sensor pixel 20 may include a first photodiode PD1. The first photodiode PD1 may receive near-infrared light from outside of the circuit diagram of FIG. 8 and generate photoelectric charges based on the received light. The first photodiode PD1 may detect light having a wavelength of about 940 nm. In some embodiments, the first photodiode PD1 may include an n-type impurity diffusion region formed in a p-type semiconductor substrate. For example, the first photodiode PD1 may be a p-n junction photodiode including an n-type impurity diffusion region and a p-type impurity diffusion region. In some embodiments, the first photodiode PD1 may include a quantum dot light absorption layer. A detailed structure of an example of the quantum dot light absorption layer is described below with reference to FIGS. 16A and 16B.

The first sensor pixel 20 may include a first signal generation circuit 12 configured to amplify an electrical signal converted by the first photodiode PD1. The first signal generation circuit 12 may include a transfer transistor TX, a reset transistor RX1, a drive transistor DX1, and a select transistor SX1. A 4T structure in which the first signal generation circuit 12 includes the four transistors is illustrated in FIG. 8, but embodiments of the inventive concepts are not limited thereto. For example, the first signal generation circuit 12 may have various circuit structures, such as a 3T structure including three transistors, a 5T structure including five transistors, or a 6T structure including six transistors.

The first photodiode PD1 may be connected to a source of the transfer transistor TX. The photoelectric charges generated by the first photodiode PD1 may be transferred to a floating diffusion node FD1 through the transfer transistor TX.

The transfer transistor TX may connect the first photodiode PD1 to the floating diffusion node FD1 or disconnect the first photodiode PD1 from the floating diffusion node FD1 according to a voltage of a transfer gate TG. While the first photodiode PD1 accumulates electrons in response to light, the transfer transistor TX may be turned off to electrically disconnect the first photodiode PD1 from the floating diffusion node FD1. When the first photodiode PD1 ends the absorption of light, the transfer transistor TX may be turned on so as to output a voltage change caused by the electrons accumulated in the first photodiode PD1. The photoelectric charges generated by the first photodiode PD1 may be transferred to the floating diffusion node FD1 through the turned-on transfer transistor TX, and the changed voltage of the first photodiode PD1 may be transferred to the floating diffusion node FD1.

Before the changed voltage of the first photodiode PD1 is transferred to the floating diffusion node FD1, the floating diffusion node FD1 may be reset by the reset transistor RX1. The reset transistor RX1 may discharge any photoelectric charges stored in the floating diffusion node FD1 at a constant period in response to a reset signal RS1. That is, a first power supply voltage VDD1 may be applied to a drain of the reset transistor RX1 and a drain of the drive transistor DX1 in a state in which light is blocked, and the reset transistor RX1 may be turned on to discharge any charges remaining in the floating diffusion node FD1.

When the output of the reset voltage of the floating diffusion node FD1 is completed, the reset transistor RX1 may be turned off and the transfer transistor TX may be turned on, so that the voltage changed by the charges accumulated in the first photodiode PD1 is transferred to the floating diffusion node FD1. The changed voltage of the floating diffusion node FD1 may be output to outside of the circuit diagram of FIG. 8 through the drive transistor DX1 and the select transistor SX1. The drive transistor DX1 may act as a source follower buffer amplifier SF1 to amplify a signal corresponding to the charges at the floating diffusion node FD1. The select transistor SX1 may transfer the amplified signal as an analog data signal V1out in response to a select signal SELL FIG. 9 is a circuit diagram of the second sensor pixel 40 illustrated in FIG. 1, according to some embodiments.

Figure 9:
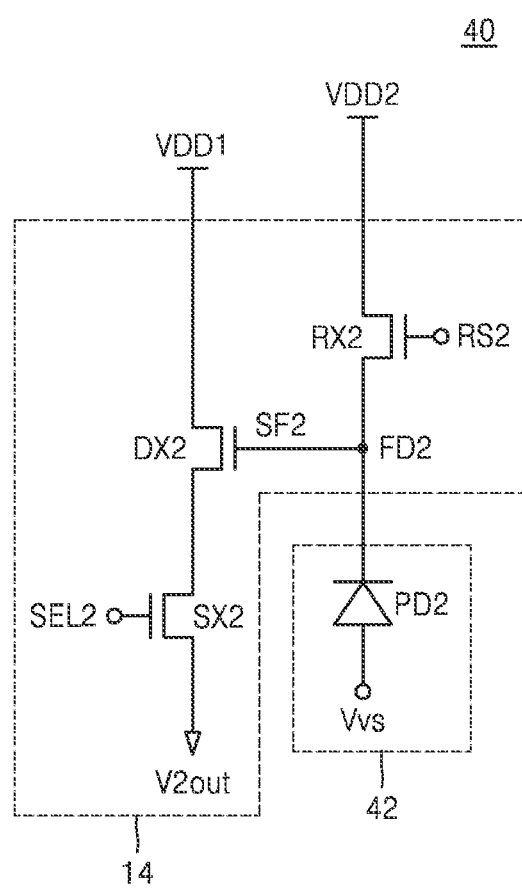
FIG. 9 is a circuit diagram illustrating a second sensor pixel of an image sensor according to some embodiments.

Referring to FIGS. 1 and 9, the second photoelectric converter 42 of the second sensor pixel 40 may include a second photodiode PD2. The second photodiode PD2 may receive near-infrared light from outside of the circuit diagram of FIG. 9 and generate photoelectric charges based on the received light. The second photodiode PD2 may detect light having a wavelength of about 810 nm. In some exemplary embodiments, the second photodiode PD2 may include an organic film. A detailed structure of an example of the organic film will be described below with reference to FIG. 13.

The second signal generation circuit 14 of the second sensor pixel 40 may not include a transfer transistor. The second signal generation circuit 14 may include a drive transistor DX2, a reset transistor RX2, and a select transistor SX2.

The second photodiode PD2 may be connected to a control voltage Vvs so that a voltage bias may be independently applied. In addition, the second photodiode PD2 may be connected to a floating diffusion node FD2. The floating diffusion node FD2 may be a source of the reset transistor RX2. The floating diffusion node FD2 may be electrically connected to a source follower gate SF2 of the drive transistor DX2. The drive transistor DX2 may be connected to the select transistor SX2.

The second photodiode PD2 may accumulate charges when the second photodiode PD2 is exposed to light and is electrically blocked from the outside, and the intensity of absorbed light may be detected. More specifically, the floating diffusion node FD2 may be reset before the changed voltage of the second photodiode PD2 is transferred to the floating diffusion node FD2. That is, a second power supply voltage VDD2 may be applied to a drain of the reset transistor RX2 in a state in which light is blocked, and a first power supply voltage VDD1 may be applied to a drain of the drive transistor DX2. Then, the reset transistor RX2 may be turned on to discharge any charges remaining in the floating diffusion node FD2. A reset voltage of the floating diffusion node FD2 may be amplified through the drive transistor DX2 and may be output to the outside when the select transistor SX2 is turned on.

A voltage changed by the charges accumulated in the second photodiode PD2 may be transferred to the floating diffusion node FD2. The changed voltage of the floating diffusion node FD2 may be output to outside of the circuit diagram of FIG. 9 through the drive transistor DX2 and the select transistor SX2. A second analog voltage V2out corresponding to the output voltage change of the floating diffusion node FD2 may be transferred to an external readout circuit (not illustrated).

Figure 10:
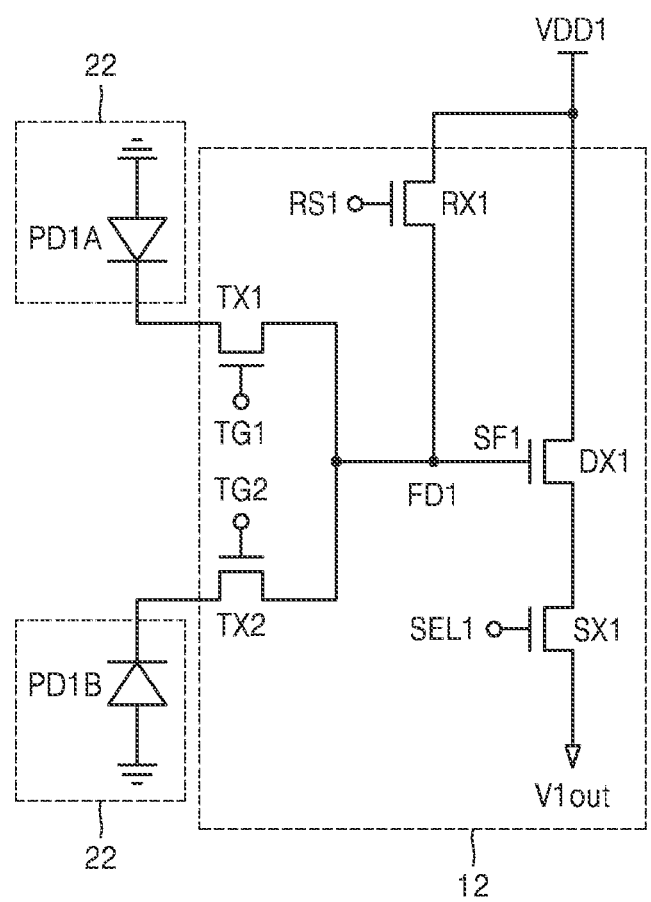
FIG. 10 is a circuit diagram illustrating a first sensor pixel of an image sensor according to some embodiments.

FIG. 10 is a circuit diagram of the first sensor pixel 20 illustrated in FIG. 1, according to some embodiments.

Referring to FIGS. 1 and 10, the first sensor pixel 20 may have a multi-shared pixel architecture in which one reset transistor RX1, one drive transistor DX1, and one select transistor SX1 are shared by two first photodiodes PD1A and PD1B and two transfer transistors TX1 and TX2. Accordingly, the first sensor pixel 20 may obtain information corresponding to two unit pixels with one shared pixel area.

More specifically, the first sensor pixel 20 may include two first photodiodes PD1A and PD1B and two transfer transistors TX1 and TX2 electrically connected to the two first photodiodes PD1A and PD1B, respectively. In some embodiments, the two first photodiodes PD1A and PD1B may be devices that detect light having different wavelengths.

In the first sensor pixel 20, the drive transistor DX1, the reset transistor RX1, and the select transistor SX1 may be shared through the floating diffusion node FD1 by the two first photodiodes PD1A and PD1B and the two transfer transistors TX1 and TX2.

The transfer transistors TX1 and TX2 may connect the two first photodiodes PD1A and PD1B to the floating diffusion node FD1 or disconnect the two first photodiodes PD1A and PD1B from the floating diffusion node FD1 according to voltages of transfer gates TG1 and TG2.

Light incident on the first photodiodes PD1A and PD1B may be accumulated in the first photodiodes PD1A and PD1B by photoelectric conversion. When the charges accumulated in the first photodiodes PD1A and PD1B are transferred to the floating diffusion node FD1, the accumulated charges may be output, as a first analog voltage V1 out, to outside of the circuit diagram of FIG. 10 through the drive transistor DX1 and the select transistor SX1. The first analog voltage V1 out corresponding to the voltage change of the floating diffusion node FD1 may be transferred to an external readout circuit (not illustrated).

Figure 11:
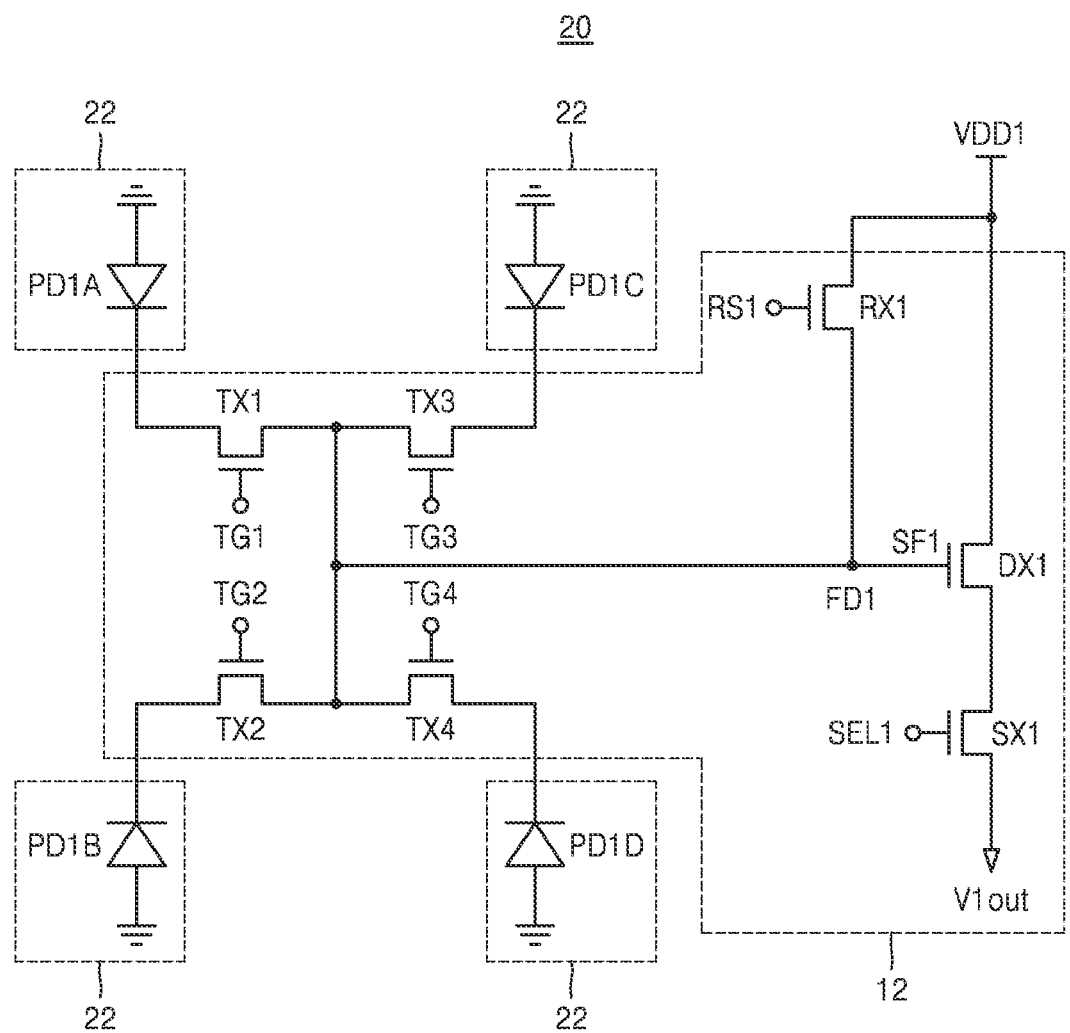
FIG. 11 is a circuit diagram illustrating a first sensor pixel of an image sensor according to some embodiments.

FIG. 11 is a circuit diagram of the first sensor pixel 20 illustrated in FIG. 1, according to some embodiments.

Referring to FIGS. 1 and 11, the first sensor pixel 20 may have a multi-shared pixel architecture in which one reset transistor RX1, one drive transistor DX1, and one select transistor SX1 are shared by four first photodiodes PD1A, PD1B, PD1C, and PD1D and four transfer transistors TX1, TX2, TX3, and TX4. Accordingly, the first sensor pixel 20 may obtain information corresponding to four unit pixels with one shared pixel area.

More specifically, the first sensor pixel 20 may include four first photodiodes PD1A, PD1B, PD1C, and PD1D and four transfer transistors TX1, TX2, TX3, and TX4 electrically connected to the four first photodiodes PD1A, PD1B, PD1C, and PD1D, respectively. In some embodiments, the four first photodiodes PD1A, PD1B, PD1C, and PD1D may include photodiodes configured to detect light having different wavelengths.

In the first sensor pixel 20, the drive transistor DX1, the reset transistor RX1, and the select transistor SX1 may be shared through the floating diffusion node FD1 by the four first photodiodes PD1A, PD1B, PD1C, and PD1D and the four transfer transistors TX1, TX2, TX3, and TX4.

The transfer transistors TX1, TX2, TX3, and TX4 may connect the four first photodiodes PD1A, PD1B, PD1C, and PD1D to the floating diffusion node FD1 or disconnect the four first photodiodes PD1A, PD1B, PD1C, and PD1D from the floating diffusion node FD1 according to voltages of transfer gates TG1, TG2, TG3, and TG4.

Light incident on the first photodiodes PD1A, PD1B, PD1C, and PD1D may be accumulated in the first photodiodes PD1A, PD1B, PD1C, and PD1D by photoelectric conversion.

When the charges accumulated in the first photodiodes PD1A, PD1B, PD1C, and PD1D are transferred to the floating diffusion node FD1, the accumulated charges may be output, as a first analog voltage V1out, to outside of the circuit diagram of FIG. 11 through the drive transistor DX1 and the select transistor SX1. The first analog voltage V1out corresponding to the voltage change of the floating diffusion node FD1 may be transferred to an external readout circuit (not illustrated).

FIGS. 10 and 11 illustrate structures in which one reset transistor RX1, one drive transistor DX1, and one select transistor SX1 are shared by two or four first photodiodes, but embodiments of the inventive concepts are not limited thereto. For example, the number of photodiodes sharing one reset transistor RX1, one drive transistor DX1, and one select transistor SX1 may be selected in the range of integers greater than or equal to 2 without limitation.

The configurations of the first sensor pixel 20 and the second sensor pixel 40 described with reference to the circuit structures of FIGS. 8 and 11 may be equally applied to the image sensors 100, 100A, 100B, 100C, 100D, 100E, and 100F described with reference to FIGS. 1 to 7.

Figure 12:
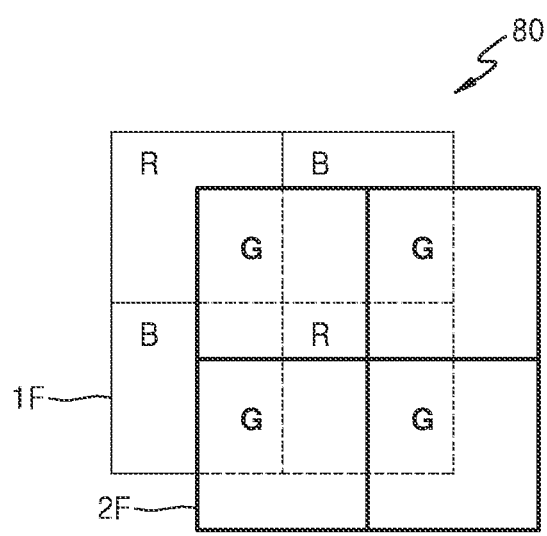
FIG. 12 is a diagram illustrating a pixel unit that may be implemented in an image sensor according to some embodiments.

FIG. 12 is a diagram of a pixel unit 80 that may be implemented in the image sensors 100, 100A, 100B, 100C, 100D, 100E, and 100F described with reference to FIGS. 1 to 11.

Referring to FIG. 12, the pixel unit 80 may have an optical stack structure or an X2 structure including a first layer 1F and a second layer 2F.

The first layer 1F disposed in a lower portion may be implemented by the first sensor pixel 20 illustrated in FIG. 1 and may include two red (R) unit pixels and two blue (B) unit pixels. The second layer 2F disposed in an upper portion may be implemented by the second sensor pixel 40 illustrated in FIG. 1 and may include four green (G) unit pixels.

In the image sensors 100, 100A, 100B, 100C, 100D, 100E, and 100F described with reference to FIGS. 1 to 12, in the optical stack structure that includes a first photodiode PD1 and a second photodiode PD2 detecting light having two different wavelengths selected from a near-infrared range, an area occupied by the first sensor pixel 20 may be different from an area occupied by the second sensor pixel 40. One first sensor pixel 20 and a plurality of second sensor pixels 40 may constitute one pixel unit, or a plurality of first sensor pixels 20 and one second sensor pixel 40 may constitute one pixel unit. It may be possible to improve sensitivity within a limited unit area of the image sensor 100. Furthermore, it may be possible to minimize or reduce waste of the pixel space in implementing the image sensor having a structure in which a plurality of sensors having different functions are integrated into one body, and it may be possible to improve the integration of the image sensor within a given area.

Figure 13:
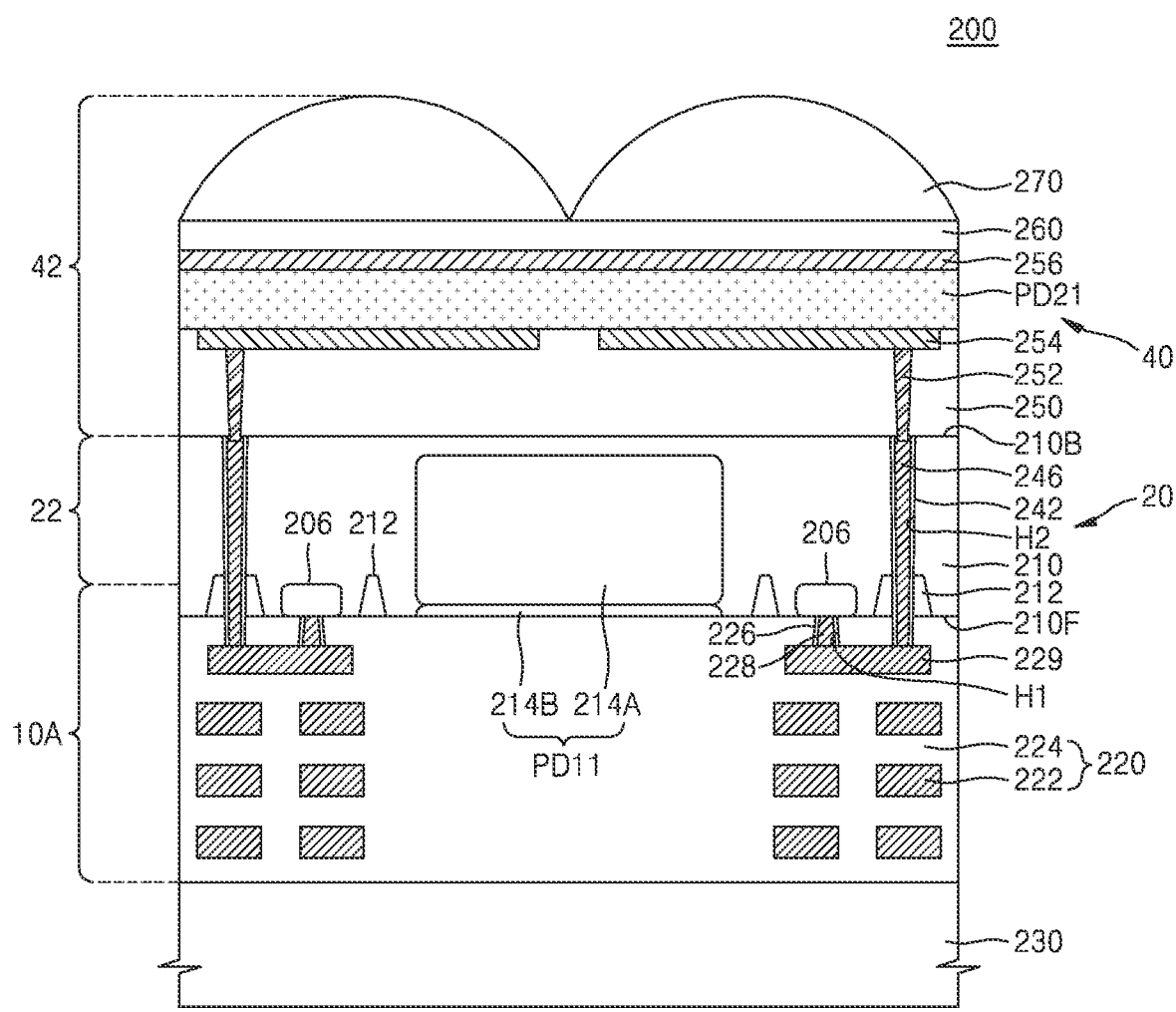
FIG. 13 is a cross-sectional view of main configurations of an image sensor according to some embodiments.

FIG. 13 is a cross-sectional view of main configurations of an image sensor 200 according to some embodiments.

A cross-sectional configuration of the image sensor 200 illustrated in FIG. 13 may be a configuration of a portion corresponding to a Q-Q' cross-section illustrated in FIG. 4A.

Referring to FIG. 13, the image sensor 200 includes a substrate 210. The substrate 210 may have a main surface 210F extending in a horizontal direction. The substrate 210 may be a semiconductor substrate, for example, a p-type silicon substrate, but embodiments of the inventive concepts are not limited thereto.

A plurality of device isolation films 212 may be disposed in the substrate 210. In addition, a first photodiode PD11 may be formed in an active region defined by the device isolation films 212 in the substrate 210. The first photodiode PD11 may correspond to, for example, the first photodiode PD1 illustrated in FIG. 8.

The first photodiode PD11 may include a first impurity region 214A and a second impurity region 214B. The first impurity region 214A may be formed at a position deeper or further from the main surface 210F of the substrate 210 than the second impurity region 214B. The first impurity region 214A and the second impurity region 214B may be different conductivity-type regions. For example, the first impurity region 214A may be an n-type impurity diffusion region, and the second impurity region 214B may be a p-type impurity diffusion region. In some embodiments, the first photodiode PD11 may detect red light or blue light. The first photodiode PD11 formed in the substrate 210 may constitute a first photoelectric converter 22.

A floating diffusion region 206 may be disposed in the substrate 210. The floating diffusion region 206 may be an n-type impurity diffusion region.

A signal generation circuit 10A may be disposed on the main surface 210F of the substrate 210. The signal generation circuit 10A and a second photoelectric converter 42 may be spaced apart from each other, with the substrate 210 disposed therebetween. The signal generation circuit 10A may include a wiring structure 220. The wiring structure 220 may include a first signal generation circuit 12A constituting the first sensor pixel 20 (see FIG. 4B) and a second signal generation circuit 14A constituting the second sensor pixel 40 (see FIG. 4B).

The first photodiode PD11 of the first photoelectric converter 22 may be connected to the first signal generation circuit 12A constituting the first sensor pixel 20.

The wiring structure 220 may include a plurality of wirings 222 and an interlayer insulating film 224 insulating the wirings 222 from one another. The wirings 222 may include a metal, for example, copper (Cu), aluminum (Al), or tungsten (W). The interlayer insulating film 224 may include an oxide film, a nitride film, or a combination thereof.

The wiring structure 220 may include a first contact hole H1, a first insulating film 226 covering an inner wall of the first contact hole H1, and a first via contact 228 surrounded by the first insulating film 226 within the first contact hole H1. The first insulating film 226 may include an oxide film or a nitride film. The first via contact 228 may include a metal, for example, Cu, Al, or W.

The wiring structure 220 may further include a conductive buffer layer 229 connected to the first via contact 228. The conductive buffer layer 229 may be electrically connected to the floating diffusion region 206 through the first via contact 228. The conductive buffer layer 229 may include Cu, Al, W, or a carbon nanotube.

In some embodiments, the image sensor 200 may include a support film 230 attached to the wiring structure 220. The support film 230 may be used to reinforce the strength of the substrate 210 that becomes thin through a polishing process. The support film 230 may include a silicon oxide film, a silicon nitride film, or a semiconductor film.

A second contact hole H2 extending through the substrate 210 in a thickness direction of the substrate 210 may be formed in the substrate 210. In some embodiments, the second contact hole H2 may penetrate the device isolation film 212. An inner wall of the second contact hole H2 may be covered with an insulating film 242. The image sensor 200 may include a via electrode 246 extending through the substrate 210 along an internal space of the second contact hole H2. The via electrode 246 in the second contact hole H2 may be surrounded by the insulating film 242. The via electrode 246 may extend from a backside surface 210B, which is a surface of an opposite side of the main surface 210F of the substrate 210, to the conductive buffer layer 229. The via electrode 246 may correspond to the via electrode 46 illustrated in FIGS. 4B and 4D. The insulating film 242 may include an oxide material or a nitride material. The via electrode 246 may include Cu, Al, or W, but embodiments of the inventive concepts are not limited to the above-described materials.

A second photoelectric converter 42 may be disposed on the backside surface 210B of the substrate 210. The second photoelectric converter 42 may include an insulating structure 250 stacked on the backside surface 210B of the substrate 210, and a conductive stud 252 extending to penetrate the insulating structure 250 and connected to the via electrode 246. The conductive stud 252 may include W or Al.

The second photoelectric converter 42 may include a second photodiode PD21 formed on the backside surface 210B of the substrate 210 above the insulating structure 250. The second photodiode PD21 may correspond to, for example, the second photodiode PD2 illustrated in FIG. 9. The second photodiode PD21 may vertically overlap the first photodiode PD11.

A bottom surface of the second photodiode PD21 may be covered with a plurality of lower electrodes 254, and a top surface of the second photodiode PD21 may be covered with an upper electrode 256. The lower electrodes 254 may be connected to the via electrode 246 through the conductive stud 252. The second photodiode PD21 may be connected to the second signal generation circuit 14A (see FIG. 4B) constituting the second sensor pixel 40 through the lower electrodes 254, the conductive stud 252, and the via electrode 246.

One lower electrode 254 may be disposed corresponding to one second sensor pixel 40 (see FIG. 4A). The second sensor pixels 40 may share one upper electrode 256.

The second photodiode PD21 may be an organic photodiode including an organic film causing a photoelectric change due to light of a specific wavelength selected from a near-infrared range. In some embodiments, the second photodiode PD21 may absorb light having a wavelength of about 810 nm. The second photodiode PD21 may collect holes among electron-hole pairs. The organic film may include an organic semiconductor material film.

The second photodiode PD21 may include an organic film in which a p-type semiconductor material and an n-type semiconductor material form a pn flat junction or a bulk heterojunction. The organic film may include a single film or a multi-layer film.

In some embodiments, the p-type semiconductor material may include a compound selected from among N,N'-dimethyl-quinacridone (DMQA) and a derivative thereof, diindenoperylene, and dibenzo{[ff]-4,4',7,7'-tetraphenyl}diindeno[1,2,3-cd:1',2',3'-lm]perylene, but embodiments of the inventive concepts are not limited thereto. The n-type semiconductor material may include a compound selected from dicyanovinyl-terthiophene (DCV3T) and a derivative thereof, perylene diimide, phthalocyanine and a derivative thereof, subphthalocyanine and a derivative thereof, and boron dipyrromethene and a derivative thereof, but embodiments of the inventive concepts are not limited thereto.

The second photodiode PD21 may have a structure selected from among various combinations such as an intrinsic layer (I layer), a p-type layer/I layer, an I layer/n-type layer, a p-type layer/I layer/n-type layer, and a p-type layer/n-type layer. The I layer may be a layer in which a p-type semiconductor compound and an n-type semiconductor compound are mixed at a ratio of about 1:100 to about 100:1. The p-type layer may include the p-type semiconductor compound. The n-type layer may include the n-type semiconductor compound.

In some embodiments, the second photodiode PD21 may have a thickness of about 1 nm to about 500 nm. The second photodiode PD21 may have a thickness so as to effectively absorb light and effectively separate and transfer holes and electrons to thereby effectively improve photoelectric conversion efficiency.

The lower electrodes 254 and the upper electrode 256 may each include a transparent conductive layer. In some embodiments, the lower electrodes 254 and the upper electrode 256 may include indium tin oxide (ITO), indium zinc oxide (IZO), ZnO, $SnO_2$, antimony-doped tin oxide (ATO), aluminum-doped zinc oxide (AZO), gallium-doped zinc oxide (GZO), $TiO_2$, or fluorine-doped tin oxide (FTO).

A plurality of microlenses 270 may be formed above the upper electrode 256. One microlens 270 may be disposed corresponding to one second sensor pixel 40. The microlens 270 may be disposed above the second photodiode PD21 and configured to concentrate light incident from the outside and make the concentrated light be incident on the second photodiode PD21.

In some embodiments, a protective layer 260 may be disposed between the upper electrode 256 and the microlens 270. The protective layer 260 may include a transparent insulating material. In some embodiments, the protective layer 260 may include a plurality of insulating films having different refractive indices. For example, the protective layer 260 may include a silicon oxide film, an aluminum oxide film, a silicon oxynitride film, or a combination thereof.

The image sensor 200 illustrated in FIG. 13 may not include a color filter. In the image sensor 200 illustrated in FIG. 13, the second photodiode PD21 may be configured to pass light incident on the second photodiode PD21 through the microlenses 270, for example, light having a wavelength of about 940 nm among light in the near-infrared range, and absorb light having a wavelength of about 810 nm. The first photodiode PD11 may be configured to absorb light having a wavelength of about 940 nm passing through the second photodiode PD21.

In the image sensor 200 illustrated in FIG. 13, the first sensor pixel 20 including the first photodiode PD11 may be configured to generate depth information of a first target object from light having a wavelength of about 940 nm, and the second sensor pixel 40 including the second photodiode PD21 may be configured to generate iris information of a second target object from light having a wavelength of about 810 nm.

FIGS. 14A to 14E are cross-sectional views for describing a method of manufacturing an image sensor, according to some embodiments. The method of manufacturing the image sensor 200 illustrated in FIG. 13 will be described with reference to FIGS. 14A to 14E.

Figure 14A:
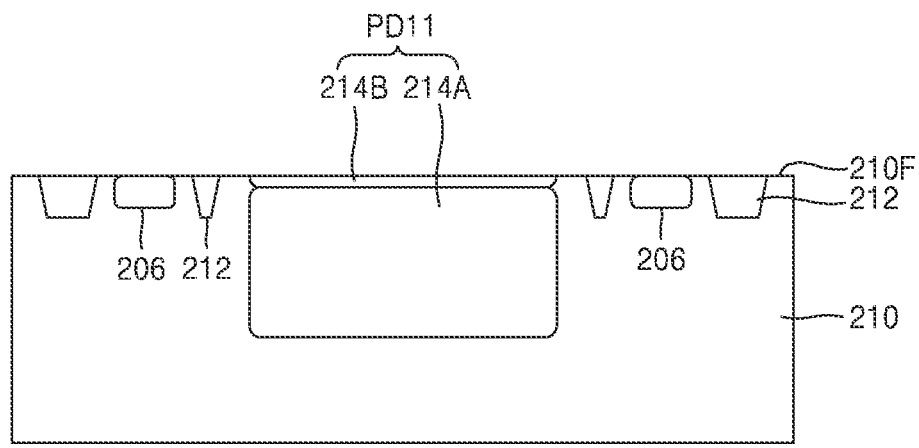
FIGS. 14A to 14E are cross-sectional views for describing a method of manufacturing an image sensor, according to some embodiments.

Referring to FIG. 14A, a substrate 210 in which an active region is defined by a device isolation film 212 is prepared. A first photodiode PD11 and a plurality of floating diffusion regions 206 are formed in the active region of the substrate 210.

The first photodiode PD11 may include a first impurity region 214A and a second impurity region 214B. The first impurity region 214A may be formed at a position deeper or further from a main surface 210F of the substrate 210, and the second impurity region 214B may be formed at a position closer to the main surface 210F of the substrate 210 than the first impurity region 214A. The first impurity region 214A and the second impurity region 214B may have different conductivity types. For example, the first impurity region 214A may be an n-type impurity diffusion region, and the second impurity region 214B may be a p-type impurity diffusion region.

The floating diffusion region 206 may be formed at a position apart from the first photodiode PD11 in the active region of the substrate 210. The floating diffusion region 206 may be an n-type impurity diffusion region.

Figure 14B:
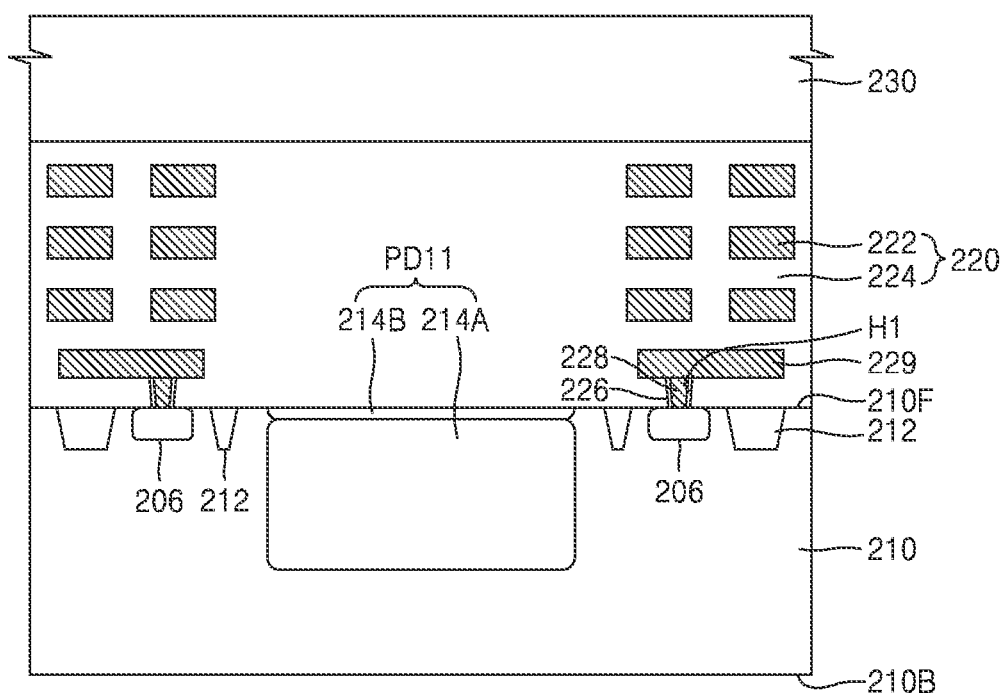

Referring to FIG. 14B, a wiring structure 220 may be formed on the main surface 210F of the substrate 210. The wiring structure 220 may include a signal generation circuit 10A including a first signal generation circuit 12A constituting a first sensor pixel 20 (see FIG. 4B) and a second signal generation circuit 14A constituting a second sensor pixel 40 (see FIG. 4B).

A support film 230 may be attached to the wiring structure 220. The support film 230 may be used to reinforce the strength of the substrate 210 that becomes thin through a polishing process to be described below with reference to FIG. 14C.

Figure 14C:
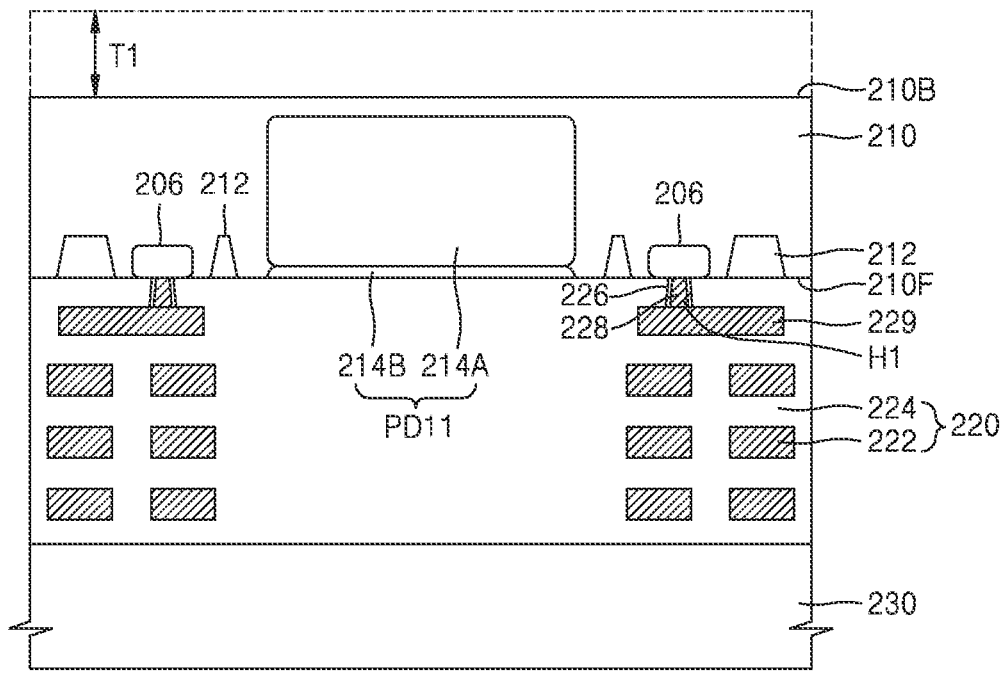

Referring to FIG. 14C, the substrate 210 may be overturned so that the wiring structure 220 is below the substrate 210 and the backside surface 210B of the substrate 210 faces upward. Then, a portion of the substrate 210 may be removed by a partial thickness T1 from the backside surface 210B of the substrate 210, thereby reducing the thickness of the substrate 210.

Figure 14D:
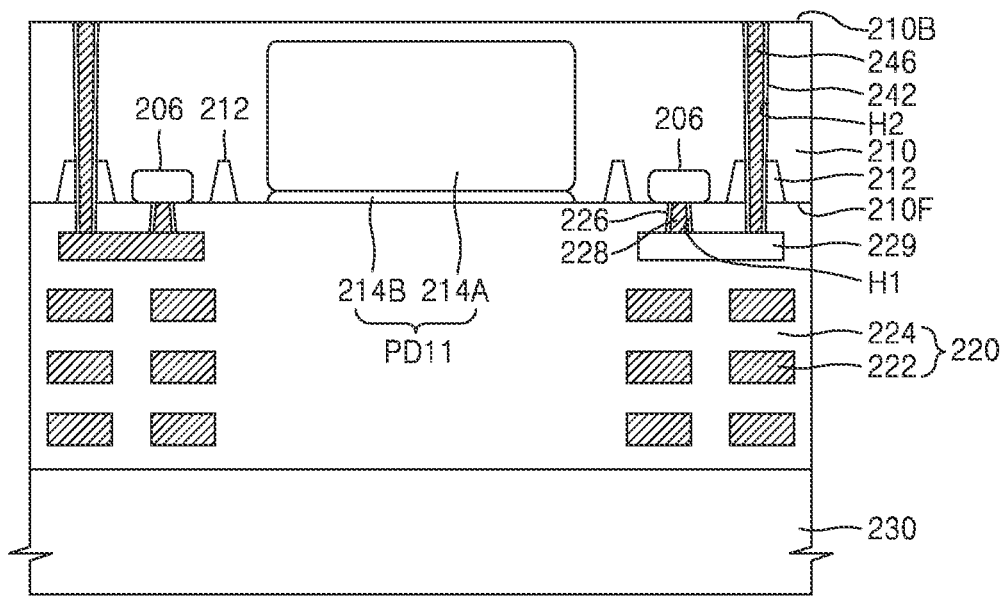

Referring to FIG. 14D, a second contact hole H2 may be formed that extends to a conductive buffer layer 229 by penetrating the substrate 210 (e.g., completely penetrating the substrate 210) from the backside surface 210B to the main surface 210F of the substrate 210 and extending into part of the interlayer insulating film 224, and an insulating film 242 may be formed to cover the inner wall of the second contact hole H2. Then, a via electrode 246 may be formed in the second contact hole H2 defined by the insulating film 242.

Figure 14E:
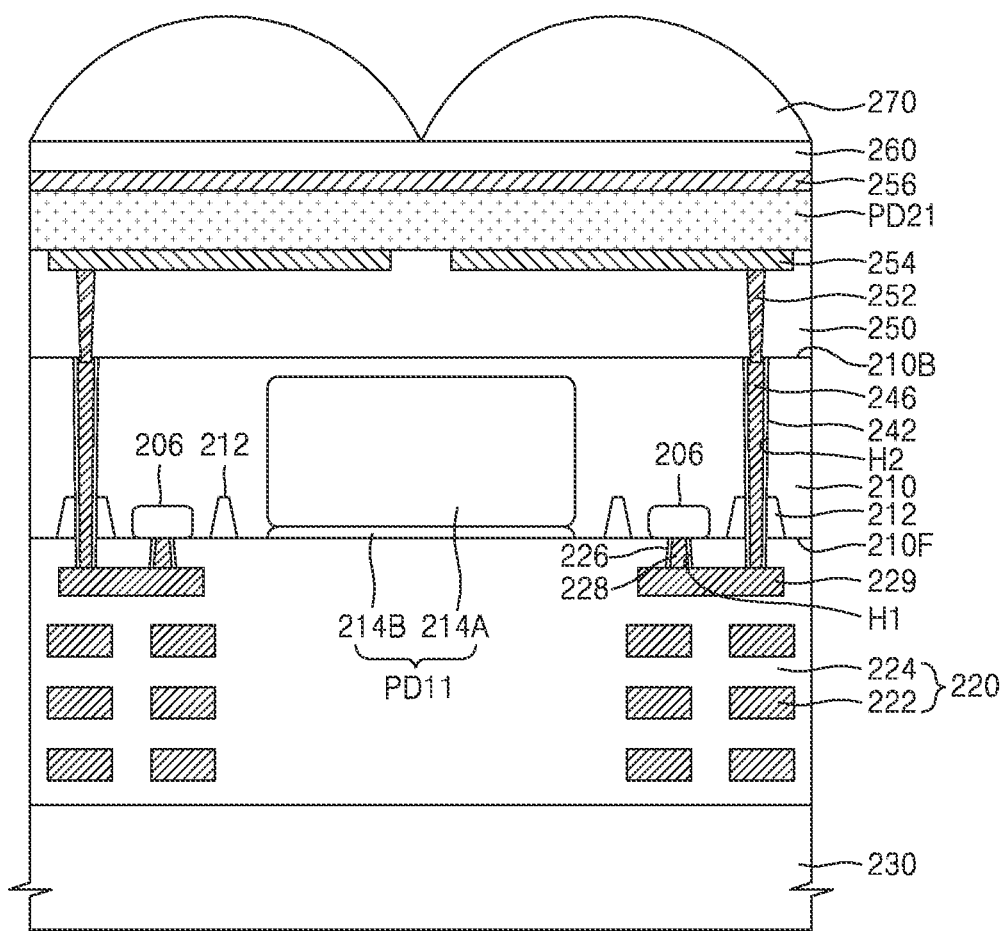

Referring to FIG. 14E, an insulating structure 250 may be formed on the backside surface 210B of the substrate 210, and a conductive stud 252 may be formed to extend through part of the insulating structure 250. A plurality of lower electrodes 254, a second photodiode PD21, an upper electrode 256, a protective layer 260, and a plurality of microlenses 270 may be sequentially formed on the insulating structure 250 and the conductive stud 252.

A spin coating process or an evaporation deposition process may be used to form the second photodiode PD21. The second photodiode PD21 may be formed to have a thickness of about 1 nm to about 500 nm.

Figure 15:
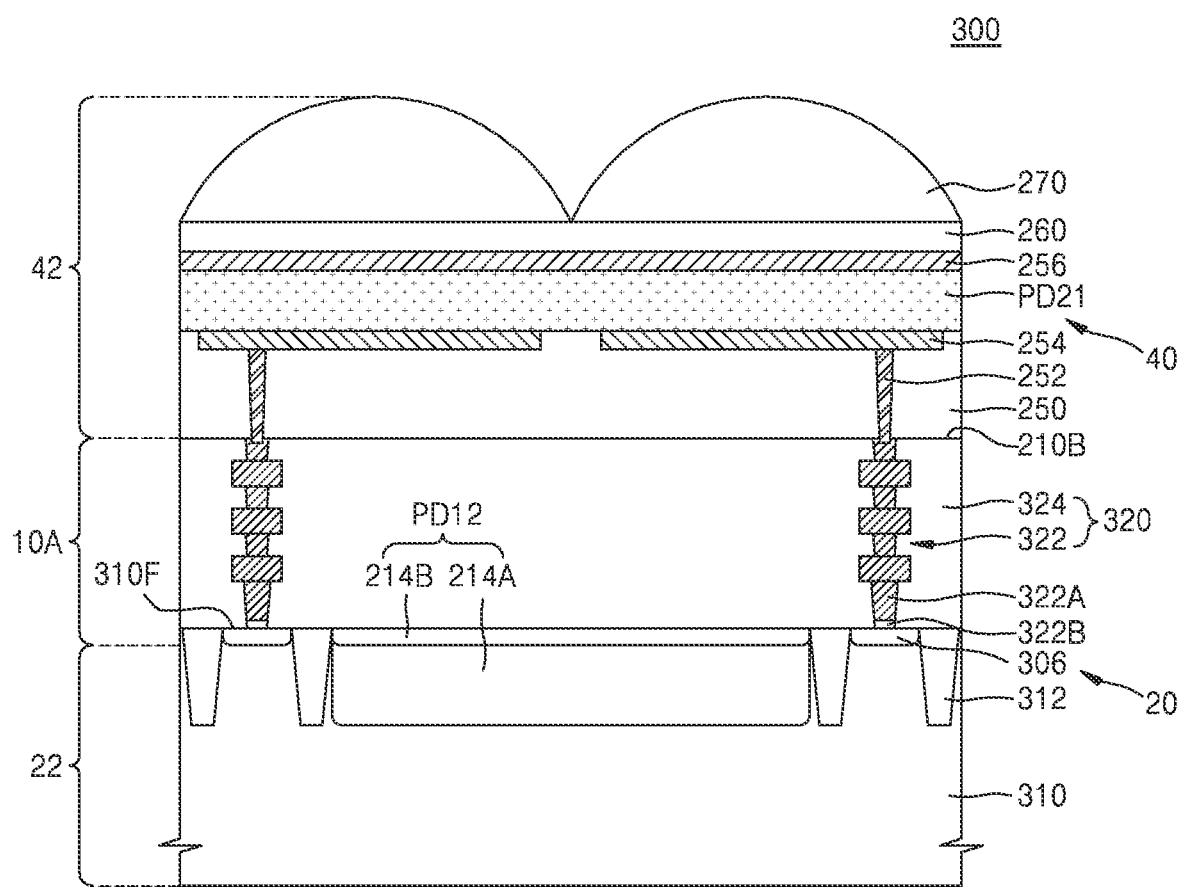
FIG. 15 is a cross-sectional view of main configurations of an image sensor according to some embodiments.

FIG. 15 is a cross-sectional view of main configurations of an image sensor 300 according to some embodiments.

The image sensor 300 illustrated in FIG. 15 may correspond to an R-R' cross-section of the image sensor 100D illustrated in FIG. 5.

Referring to FIG. 15, the image sensor 300 includes a substrate 310. The substrate 310 may have a main surface 310F extending in a horizontal direction. The substrate 310 may be a semiconductor substrate, for example, a p-type silicon substrate, but embodiments of the inventive concepts are not limited thereto.

A plurality of device isolation films 312 may be disposed in the substrate 310. In addition, a photodiode PD12 may be formed in an active region defined by the device isolation films 312 in the substrate 310. A detailed structure of the first photodiode PD12 may be substantially the same as that of the first photodiode PD11 described with reference to FIG. 13. The first photodiode PD12 may constitute a first photoelectric converter 22.

A floating diffusion region 306 may be disposed in the substrate 310. The floating diffusion region 306 may be an n-type impurity diffusion region.

A signal generation circuit 10A may be disposed on the main surface 310F of the substrate 310. The signal generation circuit 10A may include a wiring structure 320. The wiring structure 320 may include a first signal generation circuit 12A constituting a first sensor pixel 20 (see FIG. 4B) and a second signal generation circuit 14A constituting a second sensor pixel 40 (see FIG. 4B).

The wiring structure 320 may include a plurality of wirings 322, and an interlayer insulating film 324 insulating the wirings 322 from one another. The wirings 322 may include a metal, for example, Cu, Al, or W. The interlayer insulating film 324 may include an oxide film, a nitride film, or a combination thereof.

The wirings 322 may include a conductive buffer 322B, and a via contact 322A connected to the floating diffusion region 306 through the conductive buffer 322B. The conductive buffer 322B may include a carbon nanotube. The conductive buffer 322B may be made of a material having a work function between a metal work function and a silicon work function. An ohmic contact (e.g., an excellent ohmic contact) may be provided between the substrate 310 and the wiring structure 320 by the conductive buffer 322B.

A second photoelectric converter 42 may be disposed above the wiring structure 320. The second photoelectric converter 42 may include an insulating structure 250 facing the main surface 310F of the substrate 310, and a conductive stud 252 extending at least partway through the insulating structure 250 and connected to the wirings 322 of the wiring structure 320.

The second photoelectric converter 42 may include a second photodiode PD21 formed above the insulating structure 250. The second photodiode PD21 may vertically overlap the first photodiode PD12. The second photoelectric converter 42 may be spaced apart from the substrate 310, with the signal generation circuit 10A therebetween. A more detailed structure of the second photoelectric converter 42 of the image sensor 300 is substantially the same as that described with reference to FIG. 13.

In order to manufacture the image sensor 300 illustrated in FIG. 15, a substrate 310 in which an active region is defined by a device isolation film 312 may be prepared, a first photodiode PD12 and a plurality of floating diffusion regions 306 may be formed in the active region of the substrate 310, and a wiring structure 320 may be formed on a main surface 310F of the substrate 310. Then, a second photoelectric converter 42 may be formed in a manner similar to that described with reference to FIG. 14E. In forming the second photoelectric converter 42, a conductive stud 252 may be connected to one wiring selected from among the wirings 322.

Figure 16A:
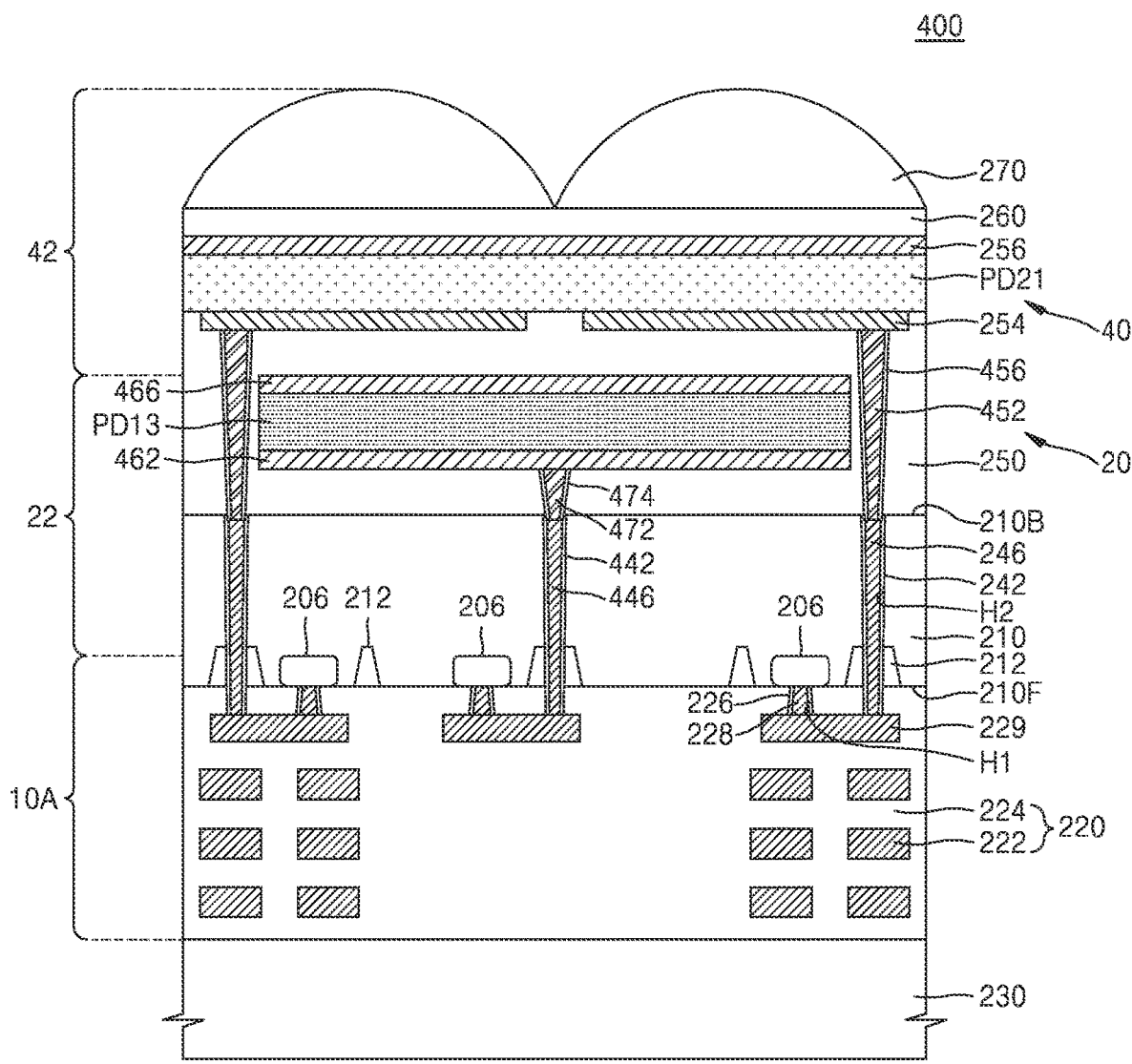
FIG. 16A is a cross-sectional view of main configurations of an image sensor according to some embodiments.

FIG. 16A is a cross-sectional view of main configurations of an image sensor 400 according to some embodiments.

A cross-sectional configuration of the image sensor 400 illustrated in FIG. 16A may be a configuration of a portion corresponding to a Q-Q' cross-section of the image sensor 100C illustrated in FIG. 4A. The image sensor 400 illustrated in FIG. 16 may have substantially the same configuration as that of the image sensor 200 illustrated in FIG. 13. However, the image sensor 400 may include a first photodiode PD13 that includes a quantum dot light absorption layer, instead of the first photodiode PD11 illustrated in FIG. 13.

In some embodiments, the quantum dot light absorption layer may include a plurality of quantum dots. The quantum dots are particles in which several hundreds to several thousands of atoms are collected, and may be a quantum dot semiconductor crystal obtained by combining quanta in units of nanometers (nm). For example, the quantum dot semiconductor crystal may include PbO, PbSe, PbS, $PbSO_3$, $PbSO_4$, InSe, CdSe, CdTe, CdS, InP, InSe, ZnO, ZnSe, ZnS, InAs, GaAs, EuS, CdTeSe/CdZnS, or a combination thereof, but embodiments of the inventive concepts are not limited thereto. The quantum dots may have a size of about 1 nm to about 20 nm. The first photodiode PD13 including the quantum dot light absorption layer may absorb light having a wavelength of about 940 nm.

A bottom surface of the first photodiode PD13 may be covered with a lower electrode 462, and a top surface of the first photodiode PD13 may be covered with an upper electrode 466. The first photodiode PD13 may be connected to a first signal generation circuit 12A of a signal generation circuit 10A (see FIG. 4B) through a via electrode 446 extending from, through, or into the lower electrode 462, a conductive stud 472, and the substrate 210. The conductive stud 472 may be surrounded by an insulating film 474. The via electrode 446 may be surrounded by an insulating film 442. Materials for forming the lower electrode 462 and the upper electrode 466 may be substantially the same as those of the lower electrode 254 and the upper electrode 256 described with reference to FIG. 13.

The second photodiode PD21 may be connected to a second signal generation circuit 14A of a signal generation circuit 10A (see FIG. 4B) through a via electrode 246 extending from, through, or into the lower electrode 254, the conductive stud 252, and the substrate 210. A conductive stud 452 may be surrounded by an insulating film 456. The conductive stud 452 may be spaced apart from the first photodiode PD13, the lower electrode 462, and the upper electrode 466, with the insulating film 456 therebetween.

Figure 16B:
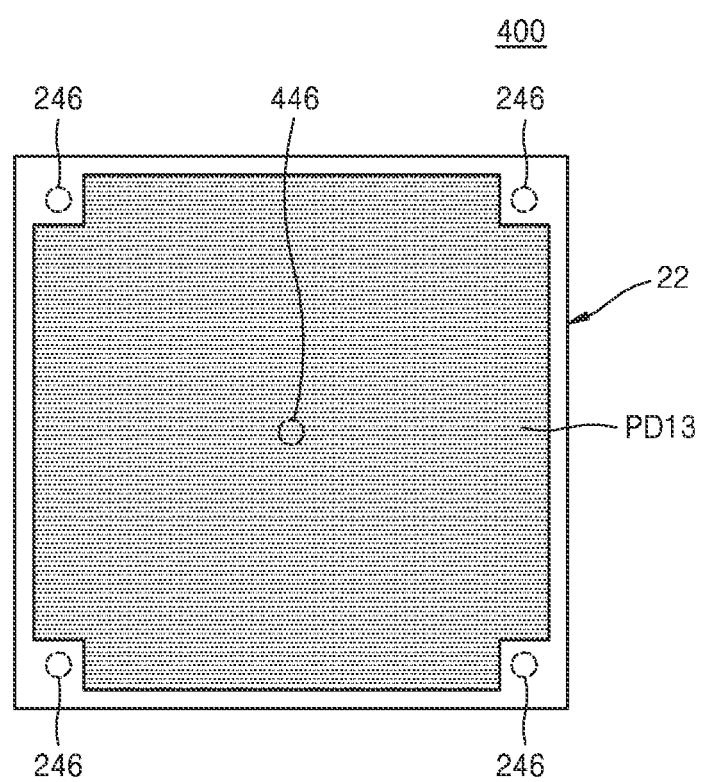
FIG. 16B is a schematic plan view of a first photodiode constituting a first photoelectric converter in the image sensor of FIG. 16A.

FIG. 16B is a schematic plan view of the first photodiode PD13 constituting the first photoelectric converter 22 in the image sensor 400 of FIG. 16A.

Figure 16C:
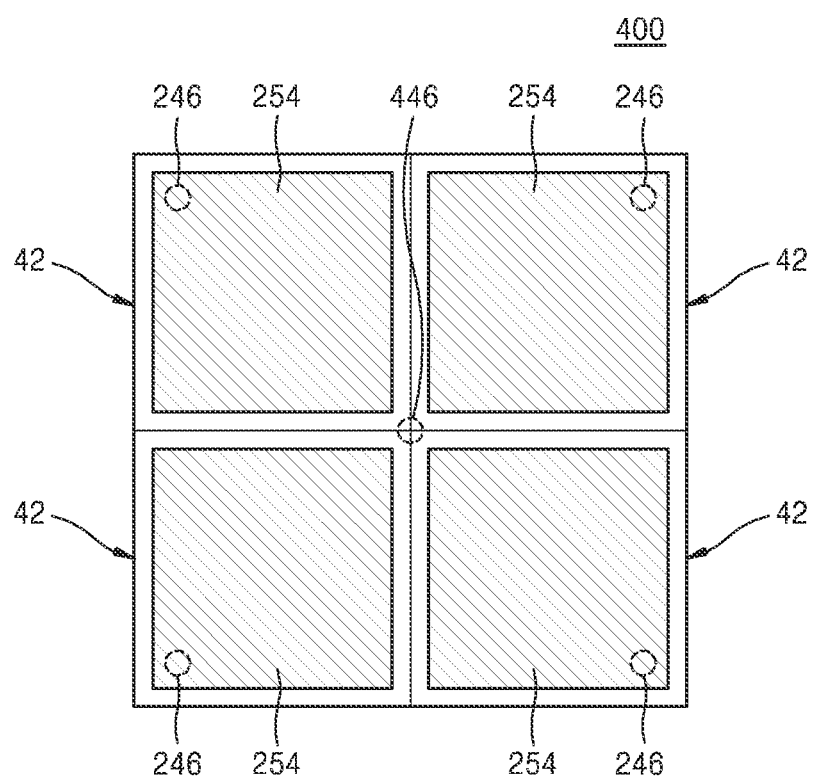
FIG. 16C is a schematic plan view of four lower electrodes constituting four second photoelectric converters disposed above one first photoelectric converter in the image sensor of FIG. 16A.

FIG. 16C is a schematic plan view of four lower electrodes 254 constituting four second photoelectric converters 42 disposed above one first photoelectric converter 22 in the image sensor 400 of FIG. 16A.

In order to help the understanding of the inventive concepts, positions of a plurality of via electrodes 246 respectively connected to a plurality of lower electrodes 254 of a second photoelectric converter 42 and a position of a via electrode 446 connected to a first photodiode PD13 through a lower electrode 462 of a first photoelectric converter 22 are indicated by dashed lines in FIGS. 16B and 16C.

In order to manufacture the image sensor 400 illustrated in FIG. 16A, a method described with reference to FIGS. 14A to 14E may be used. However, the process of forming the first photodiode PD11, which has been described with reference to FIG. 14A, may be omitted, and the via electrode 446 connected to the first photodiode PD13 may be formed together with forming the plurality of via electrodes 246 in the process described with reference to FIG. 4D. In addition, in the process described with reference to FIG. 14E, a process of sequentially forming a conductive stud 472 surrounded by an insulating film 474, a lower electrode 462, a first photodiode PD13, and an upper electrode 466 may be further included before forming the conductive stud 252, the lower electrodes 254, the second photodiode PD21, and the upper electrode 256. A deposition and dry etching process may be used to form the first photodiode PD13. The first photodiode PD13 may be connected to the via electrode 446 through the lower electrode 462 and the conductive stud 472. The via electrode 446 may be connected to the floating diffusion region 206 through the conductive buffer layer 229 included in the signal generation circuit 10A. The floating diffusion region 206 to which the via electrode 446 is connected among the plurality of floating diffusion regions 206 formed in the substrate 210 may constitute a first signal generation circuit 12A of the signal generation circuit 10A (see FIG. 4B), and may correspond to the floating diffusion node FD1 illustrated in FIG. 8.

In some embodiments, the image sensor 400 illustrated in FIG. 16A may have a 3T structure in which the first sensor pixel 20 having the first photodiode PD13 includes three transistors. In this case, if necessary, a feedback reset loop may be included so as to control a thermal noise generated in the first sensor pixel 20 and a kTC noise caused by the thermal noise.

Figure 17:
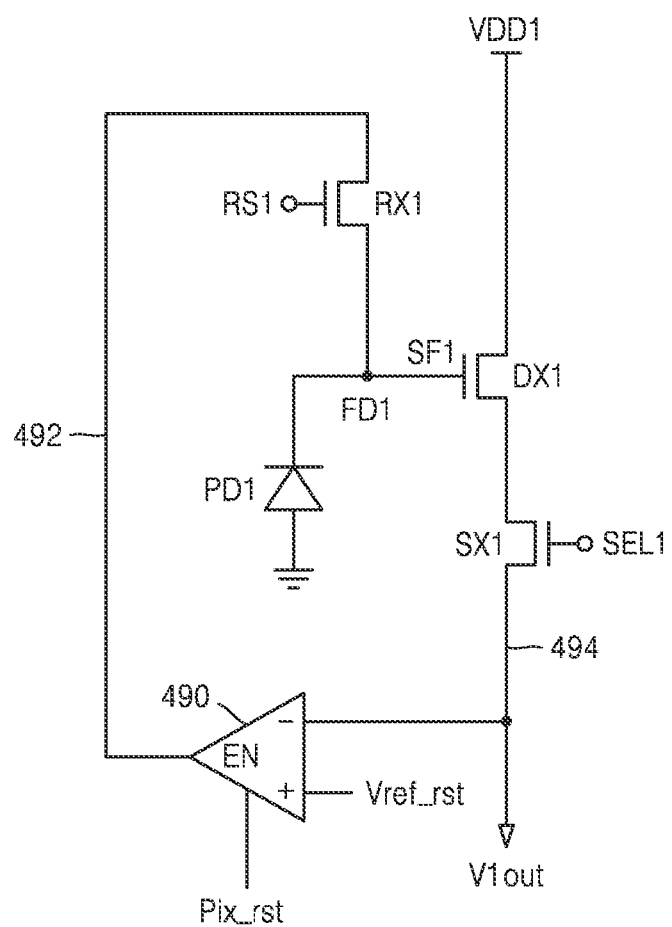
FIG. 17 is a circuit diagram illustrating a first sensor pixel of an image sensor according to some embodiments.

FIG. 17 is a circuit diagram of the first sensor pixel 20 which controls a kTC noise by using a feedback reset loop including a feedback line 492 and an operational amplifier 490.

In the circuit structure illustrated in FIG. 17, a kTC noise caused by a gain of the operational amplifier 490 may be reduced by using the operational amplifier 490 and the feedback line 492. The operational amplifier 490 may include a positive (+) input terminal connected to a reference voltage (Vref_rst) line, and a negative (−) input terminal connected to a pixel output line 494. The operational amplifier 490 may output a voltage according to a comparison between the reference voltage Vref_rst input to the positive input terminal and a voltage input from the pixel output line 494 to the negative input terminal.

The circuit structure of the first sensor pixel 20 illustrated in FIG. 17 is merely provided for helping the understanding of the inventive concepts, and various modifications and changes may be made thereto within the scope of the inventive concepts.

Figure 18:
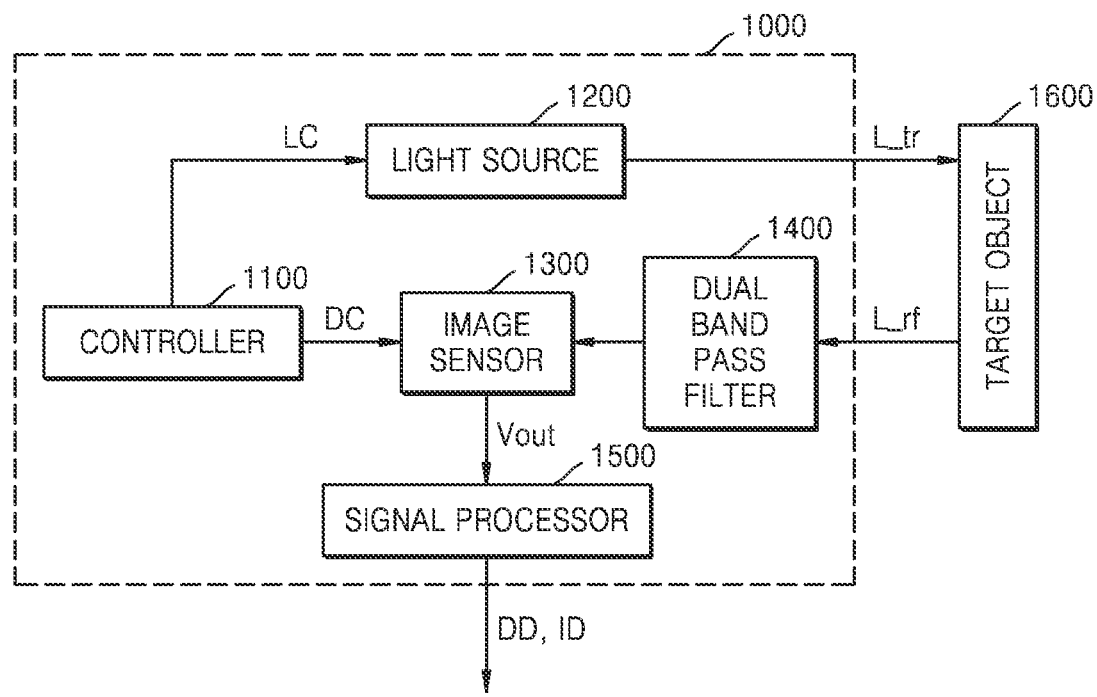
FIG. 18 is a block diagram of an image sensor module according to some embodiments.

FIG. 18 is a block diagram of an image sensor module 1000 according to embodiments.

Referring to FIG. 18, the image sensor module 1000 may include a controller 1100, a light source 1200, an image sensor 1300, a dual band pass filter 1400, and a signal processor 1500.

The controller 1100 may control operations of the light source 1200 and a plurality of pixels included in the image sensor 1300. The light source 1200 may emit pulse light L_tr, that is, light of which an on/off timing is controlled, to a target object 1600 according to a light source control signal LC. The light source 1200 may emit light of a wavelength selected from a near-infrared range to the target object 1600. The pulse light L_tr periodically emitted to the target object 1600 may be reflected from the target object 1600.

Figure 19A:
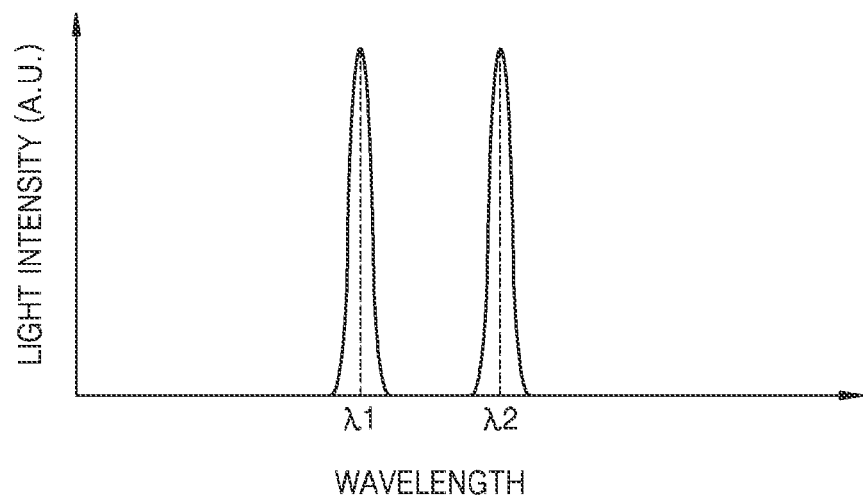
FIGS. 19A and 19B are graphs for describing light emitted by a light source included in an image sensor module according to some embodiments.
Figure 19B:
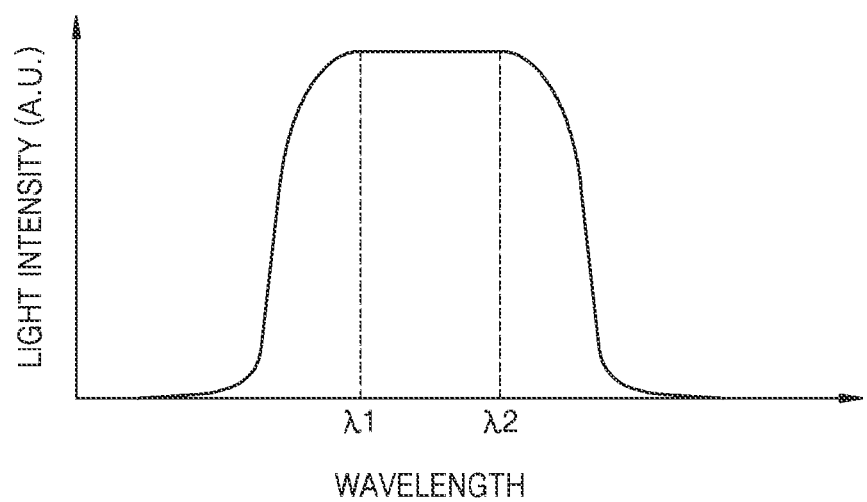

FIGS. 19A and 19B are graphs for describing light emitted by the light source 1200.

In some embodiments, the light source 1200 may include a first light source and a second light source so as to emit light having different wavelengths, as illustrated in FIG. 19A. The first light source may be configured to emit light having a first wavelength λ1 to the target object 1600, and the second light source may be configured to emit light having a second wavelength λ2 to the target object 1600. For example, the first wavelength λ1 may be about 810 nm, and the second wavelength λ2 may be about 940 nm.

Each of the first light source and the second light source may include a light-emitting diode (LED), a laser diode (LD), an organic light-emitting diode (OLED), or a combination thereof.

In some embodiments, the light source 1200 may be configured to selectively emit the light having the first wavelength λ1 and the light having the second wavelength λ2. For example, the time to emit the light having the first wavelength λ1 from the first light source and the time to emit the light having the second wavelength λ2 from the second light source according to the light source control signal LC from the controller 1100 may be independently controlled.

In some embodiments, the light source 1200 may include one light source configured to selectively emit light having different wavelengths. The one light source may selectively emit, to the target object 1600, light selected from among the light having the first wavelength λ1 and the light having the second wavelength λ2.

In some embodiments, the light source 1200 may include one light source configured to emit light of a relatively wide wavelength range including the first wavelength λ1 and the second wavelength λ2, which are different wavelengths, as illustrated in FIG. 19B. For example, the light source 1200 may include one light source configured to emit light of a relatively wide near-infrared range including light having a wavelength of about 810 nm and light having a wavelength of about 940 nm. The one light source may include an LED, an LD, an OLED, or a combination thereof. In some embodiments, the light source 1200 may be configured to selectively emit light having a wavelength of about 700 nm to about 1,100 nm selected from the near-infrared range.

The image sensor 1300 may include a pixel array including a plurality of pixels. The image sensor 1300 may generate depth information of a target object 1600 from light having a wavelength of about 940 nm by using a plurality of first sensor pixels 20 included in a plurality of pixels (see FIG. 1), and generate iris information of a second target object from light having a wavelength of about 810 nm by using a plurality of second sensor pixels 40 included in the plurality of pixels (see FIG. 1).

Figure 20:
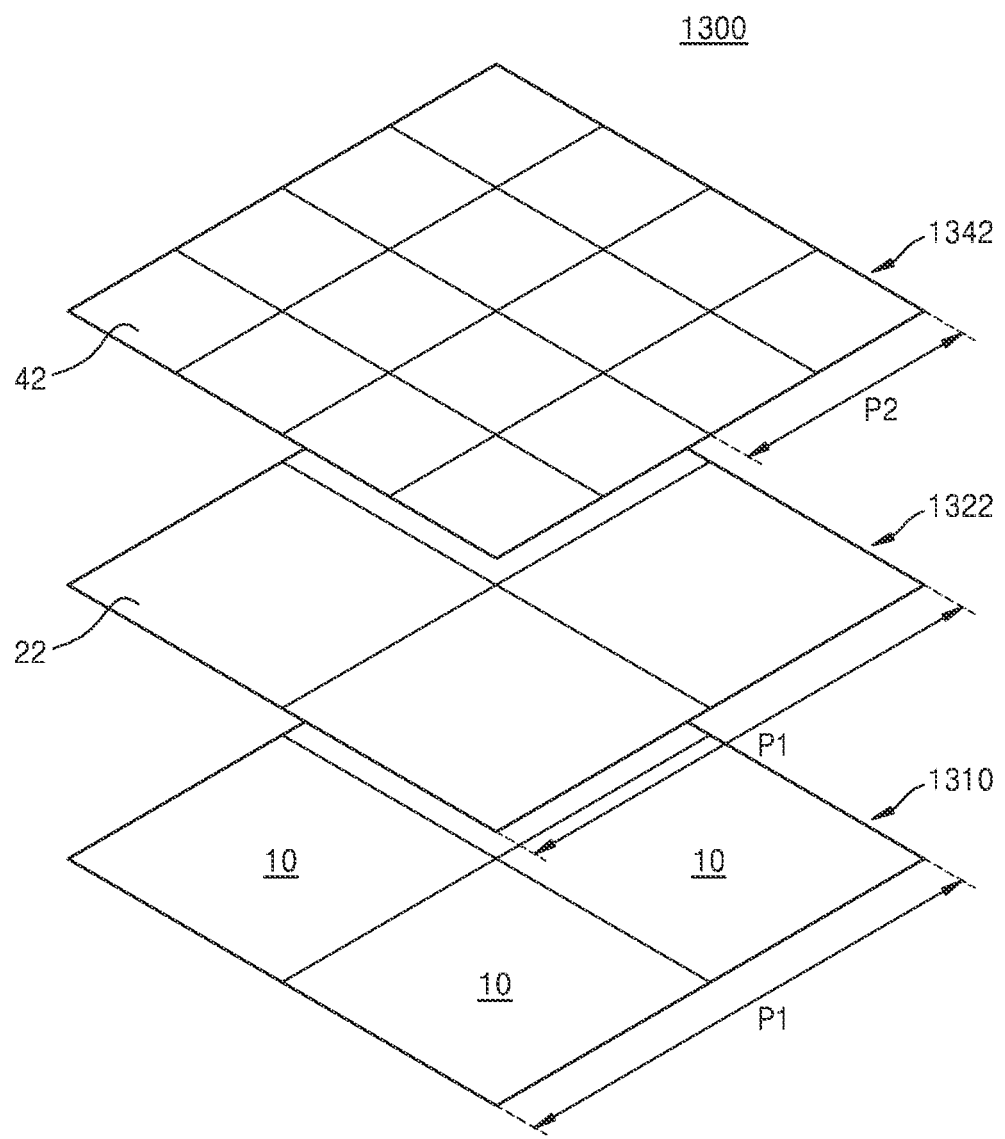
FIG. 20 is a diagram for describing a pixel array of an image sensor included in an image sensor module according to some embodiments.

FIG. 20 is a diagram for describing a pixel array constituting the image sensor 1300 of FIG. 18.

Referring to FIG. 20, the pixel array of the image sensor 1300 may include a signal generation circuit array 1310, a first photoelectric conversion array 1322, and a second photoelectric conversion array 1342, which may vertically overlap one another.

The signal generation circuit array 1310 may include a plurality of signal generation circuits 10 arranged in the form of a two-dimensional matrix in a row direction and a column direction.

The first photoelectric conversion array 1322 may constitute a plurality of depth recognition pixels for providing depth information, and may include a plurality of first photoelectric converters 22 arranged in the form of a two-dimensional matrix in a row direction and a column direction.

The second photoelectric conversion array 1342 may constitute a plurality of iris recognition pixels for providing iris information, and may include a plurality of second photoelectric converters 42 arranged in the form of a two-dimensional matrix in a row direction and a column direction.

As illustrated in FIG. 20, the signal generation circuits 10 and the first photoelectric conversion array 1322 may be repeatedly arranged at a first pitch P1 in a row direction and a column direction. The second photoelectric converters 42 may be repeatedly arranged at a second pitch P2 less than the first pitch P1 in a row direction and a column direction. For example, the first pitch P1 may be twice the second pitch P2.

However, the configuration of FIG. 20 is merely an example, and embodiments of the inventive concepts are not limited to the embodiment of FIG. 20. For example, as can be seen from the configurations of the image sensors 100E and 100F described with reference to FIGS. 6A to 6D and FIG. 7, the first photoelectric converters 22 may be repeatedly arranged at a pitch less than that of the second photoelectric converters 42.

The image sensor 1300 may have the configurations of the image sensors 100, 100A, 100B, 100C, 100D, 100E, 100F, 200, 300, and 400 described with reference to FIGS. 1 to 17, or characteristic configurations of image sensors modified and changed therefrom.

Referring to FIG. 18 again, the image sensor 1300 may receive light L_rf reflected from the target object 1600 through the dual band pass filter 1400.

The dual band pass filter 1400 may selectively pass light having a first wavelength and light having a second wavelength selected from the near-infrared range among light L_rf reflected from the target object 1600. In some embodiments, the first wavelength and the second wavelength may be different wavelengths selected from among about 810 nm and about 940 nm.

In the image sensor 1300 illustrated in FIG. 20, the second photoelectric conversion array 1342 may be arranged closer to the dual band pass filter 1400 (see FIG. 18) than the first photoelectric conversion array 1322.

A plurality of second photodiodes included in the second photoelectric conversion array 1342 of the iris recognition pixel may include, for example, the second photodiodes PD21 illustrated in FIGS. 13, 15, and 16A. The second photodiodes included in the second photoelectric conversion array 1342 may absorb one of the light having the first wavelength and light having the second wavelength having pass through the dual band pass filter 1400, and pass the unselected other thereof. For example, the dual band pass filter 1400 may pass light having a wavelength of about 810 nm and light having a wavelength of about 940 nm from among light L_rf reflected from the target object 1600, and the second photodiodes included in the second photoelectric conversion array 1342 may absorb light having a wavelength of about 810 nm and pass light having a wavelength of about 940 nm. The second sensor pixels 40 included in the image sensor 1300 (see FIG. 1) may be iris recognition pixels. In the second sensor pixels 40, the second photodiodes included in the second photoelectric conversion array 1342 may generate iris information of the target object 1600 by using an electrical signal obtained from light having a wavelength of about 810 nm.

The first photodiodes included in the first photoelectric conversion array 1322 may include, for example, the first photodiodes PD11 illustrated in FIG. 13, the first photodiodes PD12 illustrated in FIG. 15, or the first photodiodes PD13 illustrated in FIG. 16A. The first photodiodes included in the first photoelectric conversion array 1322 may absorb light having a wavelength of about 940 nm having passed through the second photodiodes included in the second photoelectric conversion array 1342. The first sensor pixels 20 included in the image sensor 1300 (see FIG. 1) may be depth recognition pixels, and may generate depth information of the target object 1600 by using an electrical signal obtained from light having a wavelength of about 940 nm in the first photodiodes included in the first photoelectric conversion array 1322. The first sensor pixels 20 included in the first photoelectric conversion array 1322 (see FIG. 1) may generate photoelectric charges according to an amount of pulse light reflected and returned from the target object 1600 by using the first photodiodes. The first photoelectric conversion array 1322 may measure a delay time of pulse light reflected and returned from the target object 1600 to which the pulse light is emitted from the light source 1200, and calculate a difference between the time to emit the pulse light and the time to detect the pulse light, that is, a distance (depth) from time of flight (TOF) to the target object 1600. The image sensor module 1000 may obtain three-dimensional image information by using information calculated by the first photoelectric conversion array 1322.

Referring to FIG. 18 again, the controller 1100 may control the operations of the light source 1200 and the image sensor 1300. For example, the controller may generate a light source control signal LC of the light source 1200 and a pixel array control signal DC for controlling the pixel array included in the image sensor, and control the operations of the light source 1200 and the image sensor 1300.

The image sensor 1300 may receive light having a wavelength selected from among light L_rf reflected from the target object 1600, for example, light having a wavelength of about 810 nm and light having a wavelength of about 940 nm, through the dual band pass filter 1400, and output a charge signal Vout according to the pixel array control signal DC received from the controller 1100.

The signal processor 1500 may output depth information DD and iris information ID based on the charge signal Vout received from the image sensor 1300.

Figure 21:
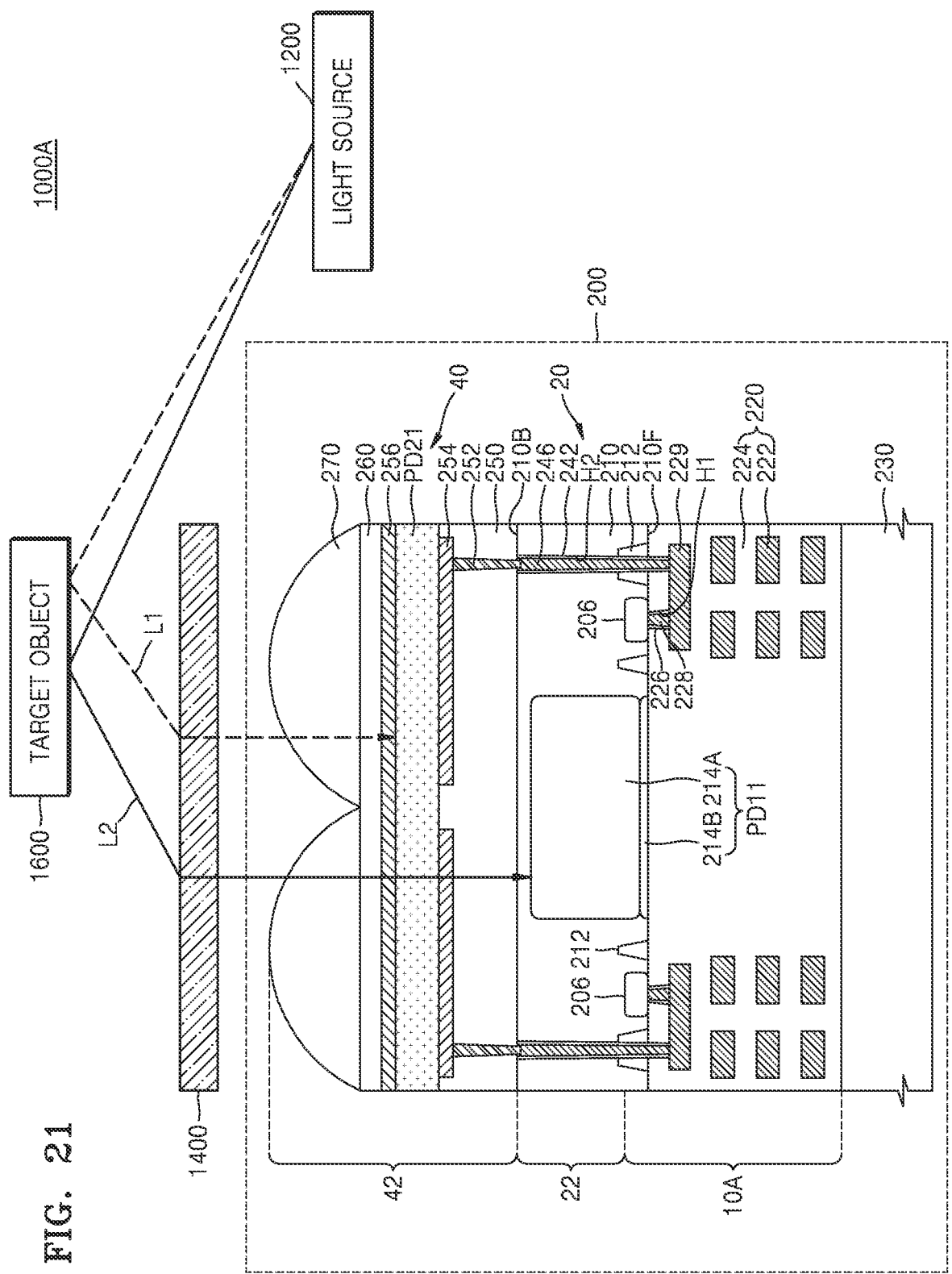
FIG. 21 is a diagram of an image sensor module according to some embodiments.

FIG. 21 is a diagram of the image sensor module 1000 described with reference to FIG. 18. An image sensor module 1000A including the image sensor 200 illustrated in FIG. 13 will be described with reference to FIG. 21.

Referring to FIG. 21, in the image sensor module 1000A, a light source 1200 may emit, to a target object 1600, light including first light L1 having a wavelength of about 810 nm and light L2 having a wavelength of about 940 nm. The first light L1 and the second light L2 may be reflected from the target object 1600 and be incident on a second photodiode PD21 through a dual band pass filter 1400 and a plurality of microlenses 270 included in the image sensor 200. The second photodiode PD21 may absorb the first light L1 having a wavelength of about 810 nm and pass the second light L2 having a wavelength of about 940 nm. The second sensor pixel 40 may generate iris information of the target object 1600 by using the first light L1.

The second light L2 having a wavelength of about 940 nm having passed through the second photodiode PD21 may be absorbed by the first photodiode PD11, and the first sensor pixel 20 may generate depth information of the target object 1600 by using the second light L2.

In the image sensor module 1000A illustrated in FIG. 21, the first sensor pixel 20 may constitute a depth recognition pixel configured to generate depth information of the target object 1600 by using the electrical signal obtained from the light having a wavelength of about 940 nm, and the second sensor pixels 40 may constitute an iris recognition sensor configured to generate iris information of the target object 1600 by using the electrical signal obtained from the light having a wavelength of about 810 nm.

However, the configuration illustrated in FIG. 21 is merely provided for helping the understanding of the inventive concepts, and various modifications and changes may be made thereto within the scope of the inventive concepts. For example, in the image sensors 100, 100A, 100B, 100C, 100D, 100E, and 100F described with reference to FIGS. 1 to 11, the first sensor pixel 20 may be configured to generate iris information of the target object 1600 by using the electrical signal obtained from light having a wavelength of about 810 nm, and the second sensor pixel 40 may be configured to generate depth information of the target object by using the electrical signal obtained from light having a wavelength of about 940 nm.

In the image sensor and the image sensor module according to the embodiments of the inventive concept, the integration of the image sensor may be improved by minimizing or reducing waste of the pixel space in implementing the image sensor having a structure in which a plurality of sensors having different functions are integrated, and the sensitivity of the image sensor may be improved within a limited unit area.

While the inventive concepts have been particularly shown and described with reference to embodiments thereof, it will be understood that various changes in form and details may be made therein without departing from the scope of the following claims.

What is claimed is:

1. An image sensor comprising:
    a substrate;
    a first sensor pixel comprising a first signal generation circuit at a first level on the substrate, and a first photoelectric converter connected to the first signal generation circuit and configured to generate first information from a first signal obtained from light having a first wavelength; and
    a second sensor pixel comprising a second signal generation circuit at the first level on the substrate, and a second photoelectric converter connected to the second signal generation circuit, vertically overlapping the first photoelectric converter, and configured to generate second information different from the first information from a second signal obtained from light having a second wavelength,
    wherein a horizontal surface area of the first photoelectric converter is different from a horizontal surface area of the second photoelectric converter, and wherein the first photoelectric converter comprises a photodiode in the substrate.

2. The image sensor of claim 1, wherein the first wavelength and the second wavelength are different wavelengths selected from a near-infrared range.

3. The image sensor of claim 1, wherein the horizontal surface area of the first photoelectric converter is greater than the horizontal surface area of the second photoelectric converter,
wherein the first sensor pixel is further configured to generate depth information of a first target object from light having a wavelength of about 940 nm, and
wherein the second sensor pixel is further configured to generate iris information of a second target object from light having a wavelength of about 810 nm.

4. The image sensor of claim 1, wherein the horizontal surface area of the first photoelectric converter is less than the horizontal surface area of the second photoelectric converter,
wherein the first sensor pixel is further configured to generate iris information of a first target object from light having a wavelength of about 810 nm, and
wherein the second sensor pixel is further configured to generate depth information of a second target object from light having a wavelength of about 940 nm.

5. The image sensor of claim 1, wherein the second photoelectric converter comprises a photodiode that includes an organic film.

6. The image sensor of claim 1, wherein the second sensor pixel further comprises a via electrode extending through the first photoelectric converter to connect the second photoelectric converter to the second signal generation circuit.

7. The image sensor of claim 1, wherein the horizontal surface area of the first photoelectric converter is four times the horizontal surface area of the second photoelectric converter.

8. The image sensor of claim 1, wherein the horizontal surface area of the second photoelectric converter is four times the horizontal surface area of the first photoelectric converter.

9. The image sensor of claim 1, further comprising a microlens above the second photoelectric converter and configured to collect light and direct the collected light to be incident on the second photoelectric converter.

10. An image sensor comprising:
a plurality of first sensor pixels arranged at a first pitch and each comprising a first photodiode;
a plurality of second sensor pixels arranged at a second pitch different from the first pitch at positions vertically overlapping the plurality of first sensor pixels, wherein each of the plurality of second sensor pixels comprises a second photodiode; and
a signal generation circuit shared by the plurality of first sensor pixels and the plurality of second sensor pixels and vertically overlapping the first photodiode and the second photodiode,
wherein the plurality of first sensor pixels each comprise a first photoelectric converter having a first width in a first horizontal direction, and
wherein the plurality of second sensor pixels each comprise a second photoelectric converter having a second width different from the first width in the first horizontal direction.

11. The image sensor of claim 10, wherein each of the plurality of first sensor pixels is configured to generate depth information of a target object by using light having a first wavelength selected from a near-infrared range,
wherein each of the plurality of second sensor pixels is configured to generate iris information of the target object by using light having a second wavelength selected from the near-infrared range and less than the first wavelength, and
wherein the first wavelength is about 940 nm, and the second wavelength is about 810 nm.

12. The image sensor of claim 10, wherein the first pitch is greater than the second pitch, and
wherein one first sensor pixel from the plurality of first sensor pixels vertically overlaps each of the plurality of second sensor pixels.

13. The image sensor of claim 10, wherein the first pitch is less than the second pitch, and
wherein one second sensor pixel from the plurality of second sensor pixels vertically overlaps each of the plurality of first sensor pixels.

14. The image sensor of claim 10, wherein the plurality of first sensor pixels each comprise one first signal generation circuit, and a plurality of first photodiodes connected to the one first signal generation circuit.

15. An image sensor module comprising:
an image sensor comprising:
a plurality of first sensor pixels arranged at a first pitch and each comprising a first photodiode;
a plurality of second sensor pixels arranged at a second pitch different from the first pitch at positions vertically overlapping the plurality of first sensor pixels, wherein each of the plurality of second sensor pixels comprises a second photodiode; and
a signal generation circuit shared by the plurality of first sensor pixels and the plurality of second sensor pixels and vertically overlapping the first photodiode and the second photodiode,
the image sensor module further comprising:
a light source configured to emit light to a target object; and
a dual band pass filter configured to selectively pass light having a first wavelength and light having a second wavelength in a near-infrared range among light reflected from the target object,
wherein, in the image sensor, the second photodiode is closer to the dual band pass filter than the first photodiode, and wherein the second photodiode is configured to selectively absorb light having the first wavelength or light having the second wavelength and pass the other of the light having the first wavelength and the light having the second wavelength, and
wherein, in the image sensor, the plurality of first sensor pixels are iris recognition pixels configured to generate iris information by using an electrical signal obtained from light having a wavelength of about 810 nm, and the plurality of second sensor pixels are depth recognition pixels configured to generate depth information by using an electrical signal obtained from light having a wavelength of about 940 nm.

16. The image sensor module of claim 15, wherein the first photodiode is configured to absorb the light passed by the second photodiode, and
wherein the first photodiode comprises an impurity diffusion region in a semiconductor substrate, or a quantum dot light absorption layer in the semiconductor substrate.

17. The image sensor module of claim 15, wherein the light source comprises a light-emitting diode (LED), a laser diode (LD), an organic light-emitting diode (OLED), or a combination thereof.

18. The image sensor module of claim 15, wherein the light source comprises a first light source and a second light source configured to emit light having different wavelengths, the first light source is configured to emit light having a wavelength of about 810 nm, and the second light source is configured to emit light having a wavelength of about 940 nm.

19. The image sensor module of claim 15, wherein the light source comprises one light source configured to selectively emit light having a wavelength of about 810 nm and light having a wavelength of about 940 nm.

20. The image sensor module of claim 15, wherein the light source is configured to emit light in a range including a first wavelength and a second wavelength that are different wavelengths in a near-infrared range.

* * * * *